(12) United States Patent
Okuyama et al.

(10) Patent No.: US 8,841,059 B2
(45) Date of Patent: Sep. 23, 2014

(54) CROSSLINKING AGENT, NEGATIVE RESIST COMPOSITION, AND PATTERN FORMING METHOD USING THE NEGATIVE RESIST COMPOSITION

(75) Inventors: Kenichi Okuyama, Tokyo-to (JP); Yasunori Nagatsuka, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 642 days.

(21) Appl. No.: 13/121,236

(22) PCT Filed: Sep. 29, 2009

(86) PCT No.: PCT/JP2009/066960
§ 371 (c)(1), (2), (4) Date: Jun. 8, 2011

(87) PCT Pub. No.: WO2010/038742
PCT Pub. Date: Apr. 8, 2010

(65) Prior Publication Data
US 2012/0115084 A1    May 10, 2012

(30) Foreign Application Priority Data
Sep. 30, 2008   (JP) .................................. 2008-252552

(51) Int. Cl.
*G03F 7/038*   (2006.01)
*G03F 7/20*    (2006.01)
*G03F 7/30*    (2006.01)
*G03F 7/38*    (2006.01)

(52) U.S. Cl.
USPC ........ 430/270.1; 430/311; 430/325; 430/330; 430/914; 430/942; 430/966; 568/729; 568/660

(58) Field of Classification Search
None
See application file for complete search history.

(56) References Cited

U.S. PATENT DOCUMENTS

| | | | |
|---|---|---|---|
| 6,132,935 A | 10/2000 | Kobayashi et al. | |
| 2002/0061462 A1 | 5/2002 | Uenishi | |
| 2010/0159217 A1* | 6/2010 | Minegishi | ........... 428/201 |

FOREIGN PATENT DOCUMENTS

| | | | |
|---|---|---|---|
| JP | 8-276558 A | 10/1996 | |
| JP | 10-239843 A | 9/1998 | |
| JP | 11-007131 A | 1/1999 | |
| JP | 11-153863 A | 6/1999 | |
| JP | 2001-281864 A | 10/2001 | |
| JP | 2002-148806 A | 5/2002 | |
| JP | 2006-215164 A | 8/2006 | |
| JP | 2008-152203 A | 7/2008 | |
| JP | 2008-281961 A | 11/2008 | |
| WO | WO 2007/148384 A1 * | 12/2007 | |
| WO | 2009/060869 A1 | 5/2009 | |

OTHER PUBLICATIONS

Hiroaki Oizumi, et al; "Development of New Negative-tone Molecular Resists Based on Calixarene for EUV Lithography", Journal of Photopolymer Science and Technology, vol. 21, No. 3, Published Jun. 24, 2008, pp. 443-449.

Junyan Dai, et al; "Molecular Glass Resists for High-Resolution Patterning", Chem. Mater., Jul. 25, 2006; Publication Date (WEB): Jun. 23, 2006 (Article), pp. 3404-3411.

G.M. Wallraff, et al; "A Chemically Amplified Photoresist for Visible Laser Direct Imaging", Journal of Imaging and Science and Technology, vol. 36, No. 5, Sep./Oct. 1992, pp. 468-476.

International Search Report: mailed Jan. 12, 2010; International Appln. No. PCT/JP2009/066960.

* cited by examiner

*Primary Examiner* — Sin J. Lee
(74) *Attorney, Agent, or Firm* — Ladas & Parry LLP

(57) ABSTRACT

A negative resist composition, which shows excellent sensitivity and resolution in pattern formation by exposure to electron beams or EUV, a novel crosslinking agent suitable for the resist composition, and a pattern forming method using the resist composition are presented. The negative resist composition comprises: (A) a polyphenol compound comprising two or more phenolic hydroxyl groups in a molecule thereof and having a molecular weight of 300 to 3,000, (B) an acid generator which directly or indirectly produces acid by exposure to active energy rays having a wavelength of 248 nm or less, and (C) a crosslinking agent represented by the chemical formula (1).

6 Claims, No Drawings

CROSSLINKING AGENT, NEGATIVE RESIST COMPOSITION, AND PATTERN FORMING METHOD USING THE NEGATIVE RESIST COMPOSITION

TECHNICAL FIELD

The present invention relates to a novel crosslinking agent, a negative resist composition and a pattern forming method using the negative resist composition.

BACKGROUND ART

Recently in the production of semiconductor elements and liquid crystal display elements, pattern size reduction has been developed rapidly with advances in lithography techniques. Accordingly, there is a demand for high resolution such as a pattern having a width of 50 nm or less.

For pattern size reduction, in general, short wavelength exposure sources has been increasingly used. Besides the currently used KrF excimer laser, lithography techniques using exposure lights such as ArF, $F_2$, EUV, x-rays, electron beams and other charged particle beams have been proposed.

Especially, pattern forming techniques using exposure to electron beams and EUV are positioned as the second-generation or the third-generation lithography techniques, and there is a demand for the development of a negative resist for forming the gate layer of a semiconductor integrated circuit, which meets all the requests for high sensitivity, high resolution and low line edge roughness (LER). As the resist material which meets such requests, a chemically amplified photosensitive composition is used, which utilizes the catalytic reaction of acid for the purpose of increasing sensitivity. A negative chemically amplified photosensitive composition comprises an alkali-soluble resin, an acid generator component which produces acid by exposure to light, a crosslinking agent, a basic compound, etc. When such a photosensitive composition is exposed to light, a crosslinking bond is formed between the resin and crosslinking agent by the action of acid produced from the acid generator component by the exposure; therefore, the photosensitive composition is changed from an alkali-soluble composition to an alkali-insoluble composition. Also, pattern exposure is possible with a smaller exposure amount since the acid produced by the crosslinking reaction catalytically repeats reaction. On the other hand, in the chemically amplified photosensitive composition, there is a contradictory relationship between sensitivity, resolution and LER, and an issue for the composition is how to balance them.

A resist material based on a polymer having a weight average molecular weight of about 10,000 or more has been used for semiconductor lithography.

However, such a polymer material has a large molecular weight and a wide molecular weight distribution, so that there is a limit to decreasing resolution or LER.

Accordingly, low-molecular-weight materials having a low molecular weight and a small molecular size have been under development, which are expected to have better resolution than polymer materials and smaller contribution to increasing LER, Examples of negative resists based on such low-molecular-weight materials include a resist comprising calix resorcinarene and a derivative thereof (Patent Literature 1 and Non-Patent Literature 1), a resist comprising a low-molecular-weight polyphenol compound derivative (Non-Patent Literature 2) and a resist comprising a cyclic polyphenol compound derivative (Patent Literature 2).

In Patent Literatures 1 and 2,2,6-bis(hydroxymethyl)-4-methylphenol (MBHP) is used as the crosslinking agent component, while methylolmelamine and methylated urea resin are used in Non-Patent Literatures 1 and 2, respectively. However, even in the case of using any of the above as the crosslinking agent component, demands for excellent sensitivity, resolution and resist shape under exposure to electron beams are not satisfied enough.

CITATION LIST

Patent Literature 1: Japanese Patent Application Laid-Open (JP-A) No. H10-239843
Patent Literature 2: JP-A No. H11-153863
Non-Patent Literature 1: Journal of Photopolymer Science and Technology, Volume 21, Number 3 (2008) 443-449
Non-Patent Literature 2: Chemistry of Materials 2006, 18, 3404-3411

SUMMARY OF INVENTION

Technical Problem

In light of the above circumstances, an object of the present invention is to provide a negative resist composition which shows excellent sensitivity and resolution in pattern formation by exposure to electron beams or EUV, a novel crosslinking agent suitable for the resist composition, and a pattern forming method using the resist composition.

Solution to Problem

The negative resist composition comprises: (A) a polyphenol compound comprising two or more phenolic hydroxyl groups in a molecule thereof and having a molecular weight of 300 to 3,000, (B) an acid generator which directly or indirectly produces acid by exposure to active energy rays having a wavelength of 248 nm or less, and (C) a crosslinking agent represented by the following chemical formula (1):

[Chemical Formula 1]

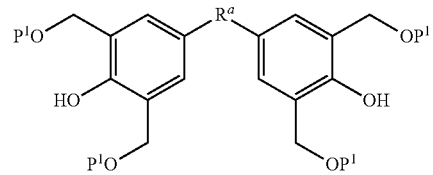

Chemical formula (1)

wherein $R^a$ is an organic group having 2 to 20 carbon atoms, and $P^1$ is a hydrogen atom or an alkyl group.

According to the present invention, by using a compound having a specific structure as the crosslinking agent contained in the negative resist composition, it is possible to optimize the solubility of the crosslinking agent in alkaline aqueous solutions and thus to obtain a well-shaped pattern with high sensitivity and high resolution.

Advantageous Effects of Invention

The present invention provides a negative resist composition which provides a well-shaped pattern with high sensitivity and high resolution, a novel crosslinking agent suitable for the resist composition, and a pattern forming method using the resist composition.

DESCRIPTION OF EMBODIMENTS

The present invention will be described hereinafter in detail.

I. Negative Resist Composition

The negative resist composition comprises: (A) a polyphenol compound comprising two or more phenolic hydroxyl groups in a molecule thereof and having a molecular weight of 300 to 3,000, (B) an acid generator which directly or indirectly produces acid by exposure to active energy rays having a wavelength of 248 nm or less, and (C) a crosslinking agent represented by the following chemical formula (1):

[Chemical Formula 2]

Chemical Formula (1)

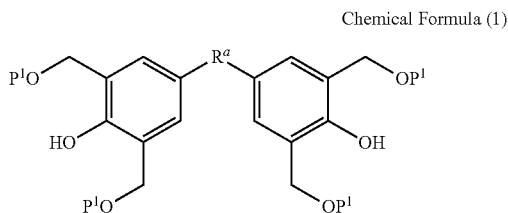

wherein $R^a$ is an organic group having 2 to 20 carbon atoms, and $P^1$ is a hydrogen atom or an alkyl group.

When 2,6-bis(hydroxymethyl)-4-methylphenol (MBHP) is used as the crosslinking agent contained in the negative resist composition, since MBHP has high solubility in alkaline aqueous solutions, the sensitivity of the resist composition could be decreased and there may be a deterioration of pattern shape.

The inventors of the present invention thought that the solubility in alkaline aqueous solutions could be decreased by increasing the hydrophobicity of a part which connects the two phenolic sites of MBHP. They optimized the structure of the compound represented by the chemical formula (1), therefore. In particular, it is thought that the hydrophobicity of the compound represented by the chemical formula (1) is increased by introducing an organic group having 2 to 20 carbon atoms into $R^a$ of the chemical formula (1) and thus there is an increase in the solubility in alkaline aqueous solutions.

Consequently, it is possible to obtain a well-shaped pattern with high sensitivity and high resolution by optimizing the solubility of the compound represented by the chemical formula (1) in alkaline aqueous solutions.

When the negative resist composition is exposed to light (irradiated with exposure light) during resist pattern formation, acid is produced from the acid generator (B) and a crosslinking bond is formed between the polyphenol compound (A) and the crosslinking agent (C) by the action of the acid; therefore, the negative resist composition is changed to an alkali-insoluble composition. During resist pattern formation, therefore, when a resist film comprising the negative resist composition is selectively exposed to light or is selectively exposed to light and then heated, an exposed portion becomes an alkali-insoluble portion while an unexposed portion remains unchanged and alkali-soluble, so that a negative resist pattern can be formed by alkali development.

The components of such a negative resist composition of the present invention will be described hereinafter in detail and in order. In the present invention, "active energy rays" means far ultraviolet rays such as KrF excimer laser, ArF excimer laser and $F_2$ excimer laser, electron beams, Buv, x-rays and the like.

In the representation of groups (atomic groups) in the present invention, a group with no representation of substitution and unsubstitution encompasses a group having a substituent and a group having no substituent. For example, "alkyl group" encompasses not only an alkyl group having no substituent (unsubstituted alkyl group) but also an alkyl group having a substituent (substituted alkyl group). A divalent bond of an alkylene group encompasses one derived from different carbon atoms (such as —$CH_2CH_2$—) and one derived from one carbon atom (such as —$CH_2$—). Also, "alkyl group" and "cycloalkyl group" encompass a saturated hydrocarbon and an unsaturated hydrocarbon having a double bond, triple bond or the like. "Cycloalkyl group" encompasses a monocyclic hydrocarbon and polycyclic hydrocarbons such as a dicyclic hydrocarbon and a tricyclic hydrocarbon.

<Polyphenol Compound (A) Comprising Two or More Phenolic Hydroxyl Groups in a Molecule Thereof and Having a Molecular Weight of 300 to 3,000>

The polyphenol compound (A) used in the present invention is a compound comprising two or more phenolic hydroxyl groups in a molecule thereof and having a molecular weight of 300 to 3,000. High resolution is provided to a pattern by setting the molecular weight of the polyphenol compound (A) within this range.

From the viewpoint of increasing pattern resolution, it is preferable that the polyphenol compound (A) used in the present invention has three or more phenolic hydroxyl groups in a molecule thereof. It is particularly preferable that the polyphenol compound (A) has four or more phenolic hydroxyl groups in a molecule thereof. When the polyphenol compound (A) has four or more phenolic hydroxyl groups in a molecule thereof, three-dimensional crosslinking is possible and thus there is an increase in pattern strength. As a result, it is possible to prevent a decrease in pattern resolution, which is due to pattern collapse that occurs after development. Therefore, there is a further increase in resolution. Because larger number of polar groups are present in a molecule thereof, there are an increase in interaction between the polar groups and a substrate and thus an improvement in adhesion therebetween. The improvement in the adhesion to the substrate leads to an increase in resolution.

In light of these effects, it is particularly preferable that the polyphenol compound (A) has four or more benzene rings in a molecule thereof, each of the rings having a phenolic hydroxyl group.

The polyphenol compound (A) used in the present invention preferably has a glass transition temperature (Tg) of 90° C. or more, more preferably 100° C. or more. If the glass transition temperature is 90° C. or more, dewetting is unlikely to occur when forming a coating film, and it is easy to obtain a uniform film. Dewetting is a phenomenon in which a spread coating film is melted during prebaking to cause cissing, thereby failing to form a film uniformly.

In general, a solvent having a boiling point of 90 to 180° C. is used for resist compositions to form a uniform resist film by spin coating or the like because, when a solvent having a low boiling point is used, the resulting resist film dries too rapidly to obtain a uniform film. A resist film formed by spin coating contains a large amount of residual solvent. To remove the solvent and form a stable resist film, the resist substrate is heated on a hot plate at 90° C. or more (prebaking). However, when a polyphenol compound having a glass transition temperature of less than 90° C. is used, dewetting occurs in the prebaking process at a higher temperature than the glass transition temperature, and a uniform film could not be obtained.

In contrast, when the polyphenol compound having a glass transition temperature of 90° C. or more is used, prebaking is possible at high temperature and thus a uniform film is obtained. In addition, a resist film with excellent environmental tolerance (e.g., post-coating delay or PCD) is obtained. Moreover, in a dry etching process after resist pattern formation, a pattern with excellent etching resistance (a property that prevents the pattern from melting upon etching at high temperature) is obtained.

The glass transition temperature used herein is that measured with a differential scanning calorimeter (DSC).

The polyphenol compound (A) used in the present invention preferably has a solubility of 0.5% by weight or more in organic solvents having a boiling point of 80 to 180° C. In this case, it is possible to prevent a resist film from rapid drying upon spin coating and thus there is an advantage that a uniform resist film is obtained. Typical examples of the organic solvents having a boiling point of 80 to 180° C. include cyclopentanone, propylene glycol monomethyl ether, cyclohexanone, propylene glycol monomethyl ether acetate, ethyl lactate, 2-heptanone, diethylene glycol dimethyl ether and 1-ethoxy-2-propanol.

It is particularly preferable that the polyphenol compound (A) used in the present invention has three or more phenolic hydroxyl groups in a molecule thereof, a glass transition temperature of (Tg) of 90° C. or more, and a solubility of 0.5% by weight or more in organic solvents having a boiling point of 80 to 180C.°.

As the polyphenol compound (A), there may be mentioned compounds represented by the following chemical formulae (2) and (4). The compound represented by the chemical formula (2) is preferable from the viewpoint of obtaining a well-shaped pattern with high sensitivity and high resolution.

[Chemical Formula 3]

Chemical Formula (2)

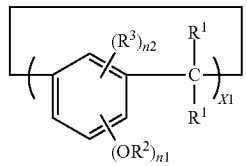

wherein each $R^1$ is independently a hydrogen atom or one selected from the group consisting of an alkyl group, a cycloalkyl group, an aryl group and a group represented by the following chemical formula (3):

[Chemical Formula 4]

Chemical Formula (3)

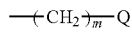

wherein Q is an aryl group or a cycloalkyl group; m is 1 or 2; each $R^2$ is independently a hydrogen atom or an organic group; at least two $R^2$s are hydrogen atoms; $R^3$ is a halogen atom or one selected from the group consisting of an alkyl group, a cycloalkyl group, an aryl group, an alkoxy group, an acyl group, a cyano group and a nitro group; n1 is an integer of 1 to 3; n2 is an integer of 0 to 2; n1 and n2 are, however, selected from these ranges so as to satisfy the formula n1+n2≤4; x1 is an integer of 3 to 12; and groups represented by the same symbol in the chemical formula (2) may be identical or different.

[Chemical Formula 5]

Chemical Formula (4)

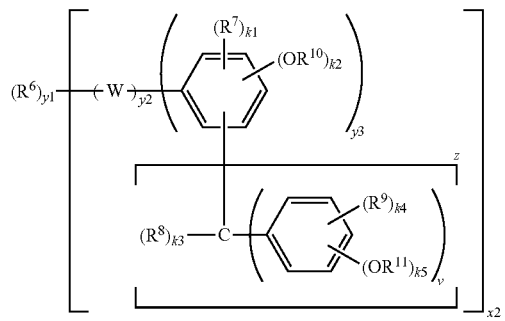

wherein $R^6$, $R^7$, $R^8$ and $R^9$ are each independently a hydrogen atom, an alkyl group or a cycloalkyl group; plural $R^6$s may be bound to form a ring; plural $R^7$s may be bound to form a ring; plural $R^8$s may be bound to form a ring; plural $R^9$s may be bound to form a ring; plural $R^6$s, $R^7$s, $R^8$s and $R^9$s may be identical or different;

wherein $R^{10}$ and $R^{11}$ are each independently a hydrogen atom or an organic group; plural $R^{10}$s and $R^{11}$s may be identical or different; and at least two of $R^{10}$s and $R^{11}$s are hydrogen atoms;

wherein W is a single bond, an alkylene group, a cycloalkylene group, an arylene group or a group comprising an optional combination thereof;

wherein x2 is a positive integer;

wherein y1 is an integer of 0 or more and with the provision that if W is a single bond, y1 is 0;

wherein y2 is an integer of 0 or more and y3 is a positive integer;

wherein z is an integer of 0 or more;

wherein v is an integer of 0 or more;

wherein k1 and k4 are a positive integer each; and wherein k2, k3 and k5 are each independently an integer of 0 or more and satisfy the following formulae: k1+k2+z=5, k3+v=3, k4+k5=5 and k2+k52.

Concerning the compound represented by the chemical formula (2), the alkyl group as $R^1$ is not particularly limited; however, it is preferably an alkyl group having 1 to 18 carbon atoms. The alkyl group can be linear or branched. For example, there may be mentioned a methyl group, an ethyl group, an n-propyl group, an n-butyl group, an i-propyl group, an i-butyl group, a t-butyl group, an i-pentyl group, a t-pentyl group and a hexadecyl group. The alkyl group can have an unsaturated bond such as a double bond or triple bond.

As a substituent that the alkyl group has, there may be mentioned a hydroxyl group, an alkoxy group, a halogen atom and a halogenoalkyl group.

The cycloalkyl group as $R^1$ is not particularly limited and there may be mentioned a cyclopropyl group, a cyclobutyl group, a cyclopentyl group, a cyclohexyl group and a cycloheptyl group, for example. The cycloalkyl group can have an unsaturated bond such as a double or triple bond and can be monocyclic or polycyclic.

As the cycloalkyl group, a cyclohexyl group is preferable.

No particular limitation is imposed on a substituent that the cycloalkyl group has. For example, there may be mentioned an alkyl group having 1 to 5 carbon atoms, a hydroxyl group, an alkoxy group, an alkoxyalkyl group, a halogen atom, a halogenoalkyl group and a cyano group.

The alkyl group having 1 to 5 carbon atoms can be linear or branched. Examples of the linear alkyl group include a methyl group, an ethyl group, an n-propyl group and an n-butyl group. Examples of the branched alkyl group include an i-propyl group, an i-butyl group, a t-butyl group, an i-pentyl group and a t-pentyl group.

The alkoxy group is not particularly limited; however, it is preferably an alkoxy group having 1 to 8 carbon atoms. For example, there may be mentioned a methoxy group, an ethoxy group, a propoxy group, a butoxy group and a 2-ethylhexyloxy group.

The alkoxyalkyl group is not particularly limited; however, it is preferably an alkoxyalkyl group having 1 to 8 carbon atoms. For example, there may be mentioned a methoxymethyl group, an ethoxymethyl group, a methoxyethyl group, an ethoxyethyl group and a methoxypropyl group.

As the halogen atom, there may be mentioned a fluorine atom, a chlorine atom, a bromine atom and an iodine atom.

The halogenoalkyl group is not particularly limited; however, it is preferably a halogenoalkyl group having 1 to 8 carbon atoms. For example, there may be mentioned a chloromethyl group, a dichloromethyl group, a trichloromethyl group, a bromomethyl group, a dibromomethyl group, a tribromomethyl group, a fluoromethyl group, a difluoromethyl group, a trifluoromethyl group, a 1-chloroethyl group, a 1-bromoethyl group, a 1-fluoroethyl group, a 1,2-dichloroethyl group and a 1,1,2,2-tetrachloroethyl group.

The aryl group as $R^1$ is not particularly limited; however, it preferably has 6 to 14 carbon atoms, more preferably 6 to 10 carbon atoms. For example, there may be mentioned a phenyl group, a naphthyl group and an anthryl group.

As a substituent that the aryl group has, there may be mentioned a cycloalkyl group, an alkyl group having 1 to 5 carbon atoms, a hydroxyl group, an alkoxy group, an alkoxyalkyl group, a halogen atom and a halogenoalkyl group.

As the cycloalkyl group as the substituent of the aryl group, there may be mentioned those that are the same as the above-mentioned cycloalkyl group which may have a substituent.

As the following as the substituent of the aryl group: the alkyl group having 1 to 5 carbon atoms, the alkoxy group, the alkoxyalkyl group, the halogen atom and the halogenoalkyl group, there may be mentioned those that are the same as the cycloalkyl group.

As the aryl group and cycloalkyl group as Q of the chemical formula (3) and as a substituent that the groups have, there may be mentioned those that are the same as $R^1$.

The organic group as $R^2$ is not particularly limited and there may be mentioned an alkyl group, a cycloalkyl group and an aryl group.

As the alkyl group, cycloalkyl group and aryl group as $R^2$ and as a substituent that the groups have, there may be mentioned those that are the same as $R^1$.

As the halogen atom and alkyl group as $R^3$, there may be mentioned those that are the same as $R^1$.

As a substituent that the alkyl group as $R^3$ has, there may be mentioned a cycloalkyl group, an aryl group, an amino group, an amide group, an ureido group, an urethane group, a hydroxyl group, a carboxy group, a halogen atom, an alkoxy group, a thioether group, an acyl group, an acyloxy group, an alkoxycarbonyl group, a cyano group and a nitro group, for example.

As the cycloalkyl group, aryl group and alkoxy group as $R^3$, all of which may have a substituent, there may be mentioned those that are the same as $R^1$.

The acyl group as $R^3$ is not particularly limited; however, it is preferably an acyl group having 1 to 8 carbon atoms. For example, there may be mentioned a formyl group, an acetyl group, a propionyl group, a butyryl group, a valeryl group, a pivaloyl group and a benzoyl group.

Also, X1 is an integer of 3 to 12, preferably an integer of 4 to 12, more preferably an integer of 4 to 8.

As long as the compound represented by the chemical formula (2) has two or more phenolic hydroxyl groups, in the repeating units, substituents represented by the same symbol may be identical or different; in the repeating units, the position of $OR^2$s and that of $R^3$s may be identical or different; and in the repeating units, the numbers of n1s may be identical or different and the numbers of n2s may be identical or different. For example, in the compound represented by the chemical formula (2), when X1 is 4, all repeating units may be identical like the following chemical formula (5) or may be different like the following chemical formula (6):

[Chemical Formula 6]

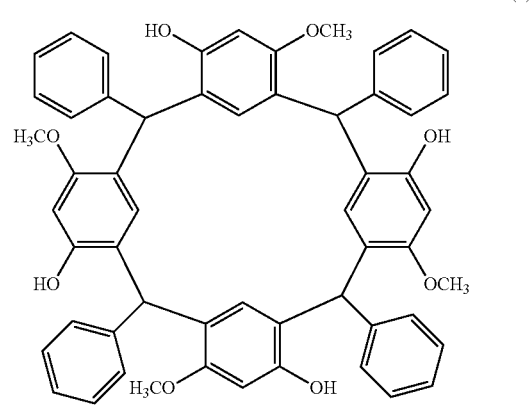

Chemical Formula (5)

[Chemical Formula 7]

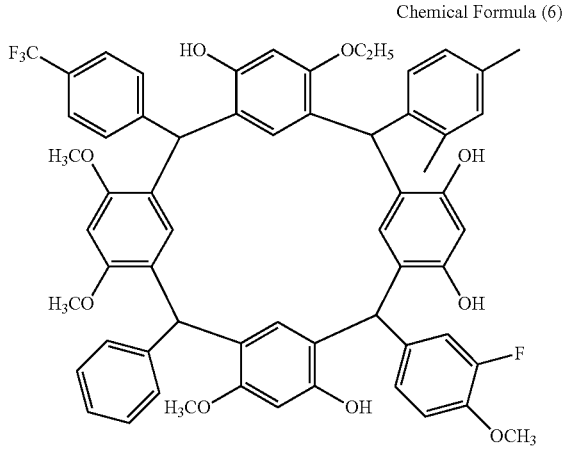

Chemical Formula (6)

In the compound represented by the chemical formula (2), from the viewpoint of obtaining a well-shaped pattern with high sensitivity and high resolution, it is preferable that X1 is 4 and n1 is 2 or 3, and it is more preferable that x1 is 4 and n1 is 2, that is, a calix resorcinarene derivative in which two to eight of eight $R^2$s are hydrogen atoms, is more preferable.

From the viewpoint of achieving high resolution while using a highly-concentrated developer, a calix resorcinarene derivative in which two to four eight $R^2$s are hydrogen atoms is still more preferable, and a calix resorcinarene derivative is particularly preferable, in which one of two $R^2$s in each repeating unit of the chemical formula (2) is a hydrogen atom and the other is an organic group, and there are four hydrogen atoms in one molecule.

In the compound represented by the chemical formula (4), the alkyl group as $R^6$, $R^7$, $R^8$ and $R^9$ can be linear or branched and is preferably one having 1 to 10 carbon atoms such as a methyl group, an ethyl group, a propyl group, a butyl group, an isobutyl group, a hexyl group and an octyl group.

The cycloalkyl group as $R^6$, $R^7$, $R^8$ and $R^9$ can be monocyclic or polycyclic. For example, there may be mentioned a group having 5 or more carbon atoms and a monocyclo, bicyclo, tricyclo or tetracyclo structure or so on. The number of carbon atoms is preferably 6 to 30, more preferably 7 to 25, and there may be mentioned an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group, for example. These alicyclic hydrocarbon groups may have a substituent.

As a substituent that the alkyl or cycloalkyl group may have, there may be mentioned a hydroxyl group, a carboxyl group, a halogen atom (a fluorine atom, a chlorine atom, a bromine atom, an iodine atom) and an alkoxy group (a methoxy group, an ethoxy group, a propoxy group, a butoxy group), for example.

As the organic group as $R^{10}$ and $R^{11}$, there may be mentioned an alkyl group, an aryl group, an aralkyl group, an alkoxy group, an alkoxycarbonyl group, an amide group and a cyano group, for example. The alkyl group is preferably an alkyl group having 1 to 10 carbon atoms or a cycloalkyl group, and there may be mentioned a methyl group, an ethyl group, a propyl group, an n-butyl group, a sec-butyl group, a hexyl group, a 2-ethylhexyl group, an octyl group, a cyclopropyl group, a cyclobutyl group, a cyclohexyl group and an adamantyl group, for example. The aryl group is preferably an aryl group having 6 to 14 carbon atoms, and there may be mentioned a phenyl group, a naphthyl group and an anthracenyl group, for example. The aralkyl group is preferably an aralkyl group having 6 to 12 carbon atoms, and there may be mentioned a benzyl group, a phenethyl group and a cumyl group, for example. The alkoxy group and the alkoxy group of the alkoxycarbonyl group are preferably an alkoxy group having 1 to 5 carbon atoms, and there may be mentioned a methoxy group, an ethoxy group, a propoxy group, an n-butoxy group and an isobutoxy group, for example.

The alkylene group as W can be linear or branched and is preferably one having 1 to 10 carbon atoms. For example, there may be mentioned a methylene group, an ethylene group, a propylene group, a butylene group and an isobutylene group.

The cycloalkylene group as W can be monocyclic or polycyclic. As the alkylene group comprising the ring, there may be mentioned a cycloalkylene group having 3 to 8 carbon atoms (such as a cyclopentylene group or a cyclohexylene group).

The alkylene group and cycloalkylene group as W may have a substituent. Examples of the substituent include an alkyl group (preferably one having 1 to 10 carbon atoms, such as a methyl group, an ethyl group, a propyl group, an isopropyl group, an n-butyl group, an isobutyl group, a sec-butyl group, a t-butyl group, a pentyl group, a hexyl group, a heptyl group, an octyl group, a nonyl group and a decyl group), an alkoxy group (preferably one having 1 to 4 carbon atoms, such as a methoxy group, an ethoxy group, a propoxy group and a butoxy group), a fluorine atom, a chlorine atom, a bromine atom and an iodine atom.

The alkylene chain or cycloalkylene chain may contain —O—, —OC(=O)—, —OC(=O)O—, —N(R)—C(=O)—, —N(R)—C(=O)O—, —S—, —SO— and/or —SO$_2$— in the chain. Herein, R is a hydrogen atom or an alkyl group (preferably one having 1 to 10 carbon atoms, such as a methyl group, an ethyl group, a propyl group, an isopropyl group, an n-butyl group, an isobutyl group, a sec-butyl group, a t-butyl group, a pentyl group, a hexyl group, a heptyl group, an octyl group, a nonyl group and a decyl group).

The cyclic arylene group as W is preferably one having 6 to 15 carbon atoms, such as a phenylene group, a tolylene group and a naphthylene group.

In the polyphenol compound (A), as long as two or more phenolic hydroxyl groups are present in a molecule thereof, a phenolic hydroxyl group of a compound (parent compound) which will be the mother nucleus of a polyphenol compound, may be protected by an organic group.

Specific examples of the parent compound of the polyphenol compound (A) are shown below. The present invention is not limited to these examples, however. The following phenolic hydroxyl group examples may be protected by an organic group if two or more phenolic hydroxyl groups are present in a molecule thereof.

[Chemical Formula 8]

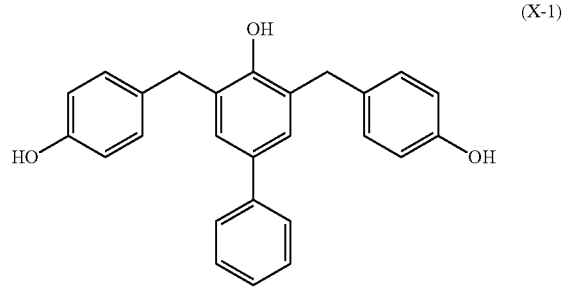

(X-1)

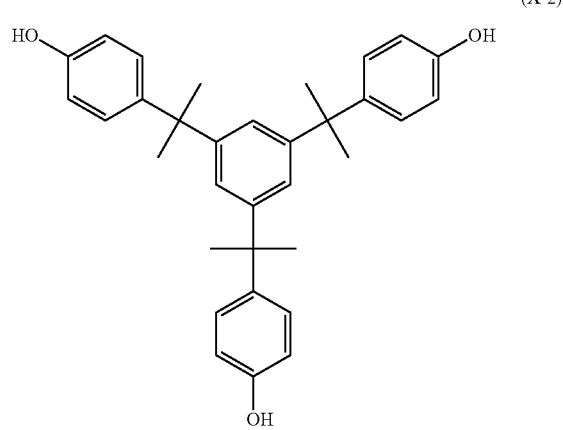

(X-2)

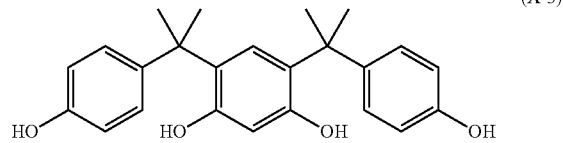

(X-3)

(X-4)
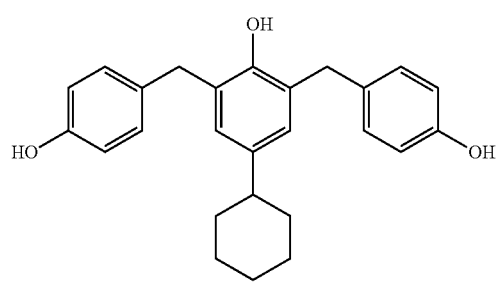
(X-5)
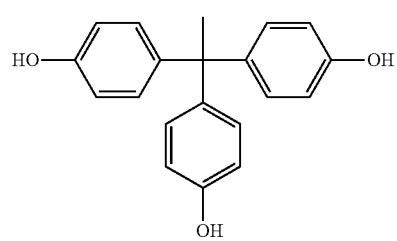
(X-6)
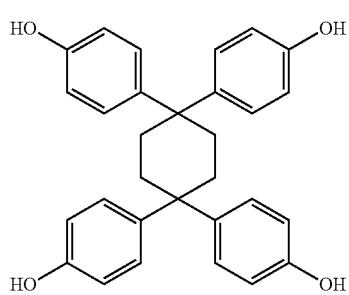
(X-7)
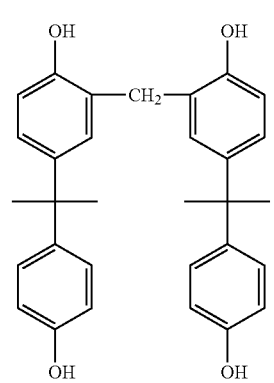
(X-8)
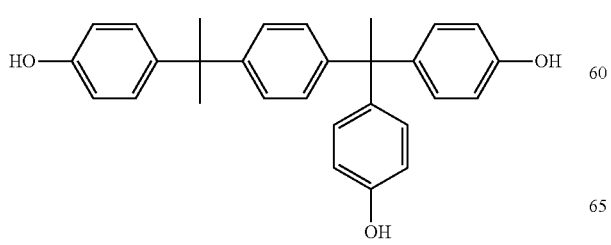
(X-9)
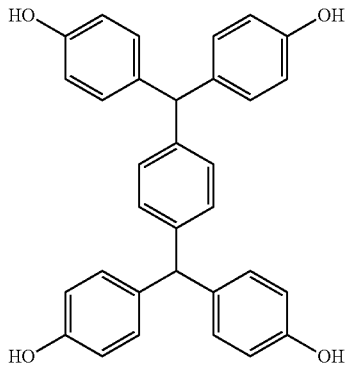
(X-10)
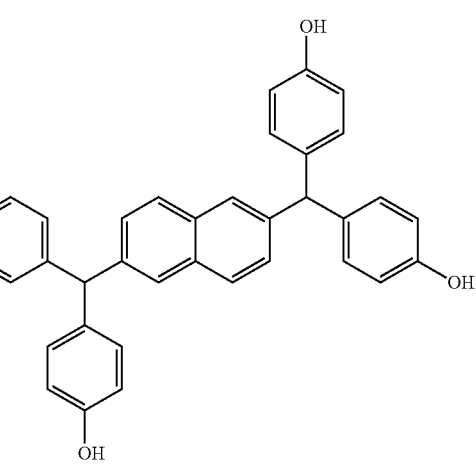
(X-11)
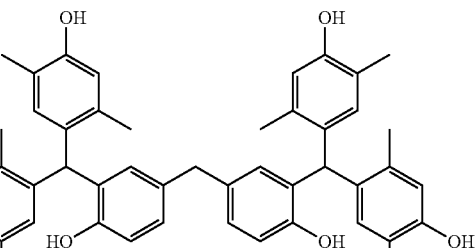
[Chemical Formula 9]
(X-12)
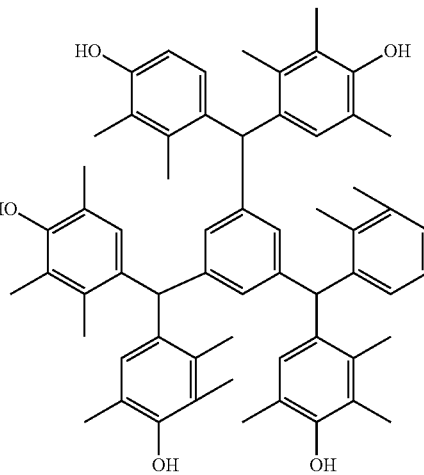

(X-13)
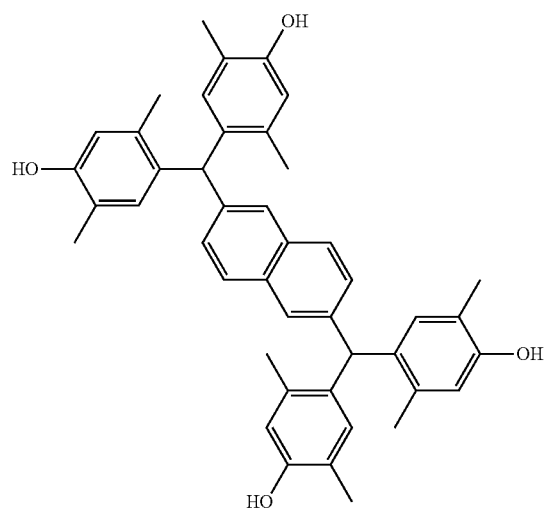
(X-14)
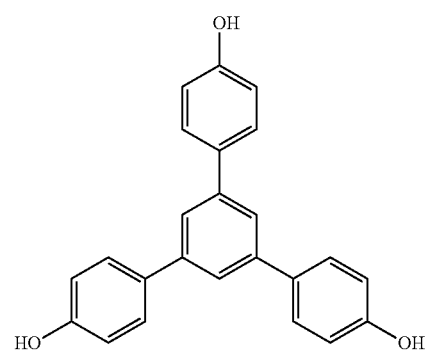
(X-15)
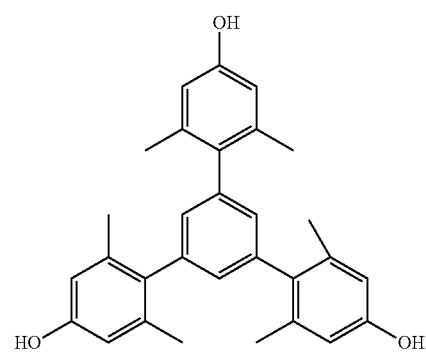
(X-16)
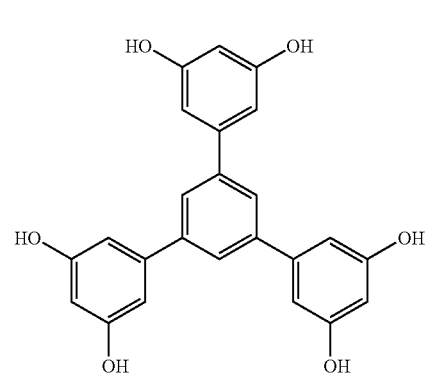
(X-17)
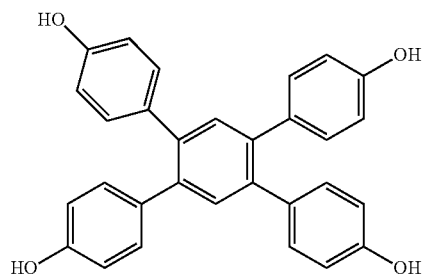
(X-18)
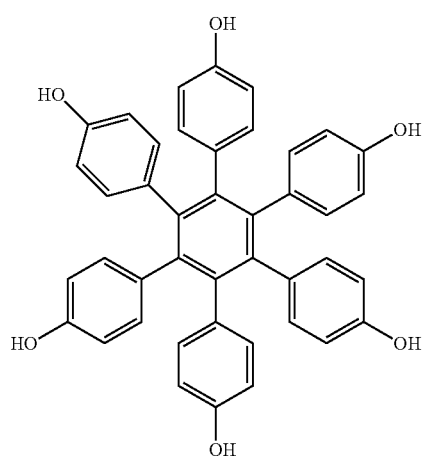
(X-19)
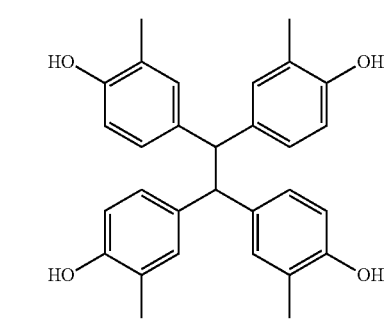
(X-20)
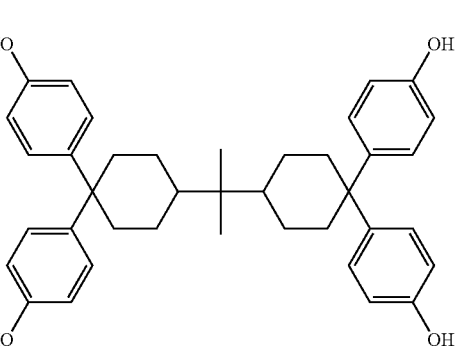
[Chemical Formula 10]
(X-21)
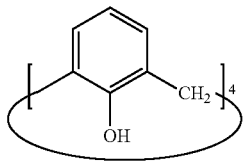

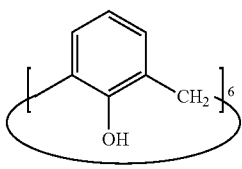 (X-22)
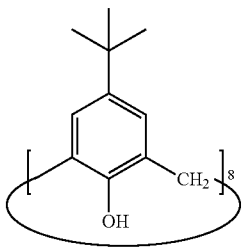 (X-23)
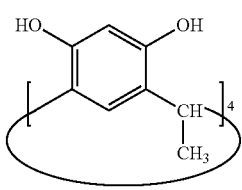 (X-24)
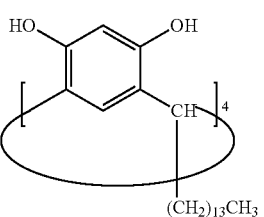 (X-25)
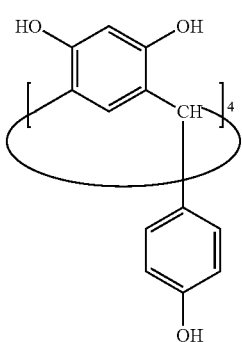 (X-26)
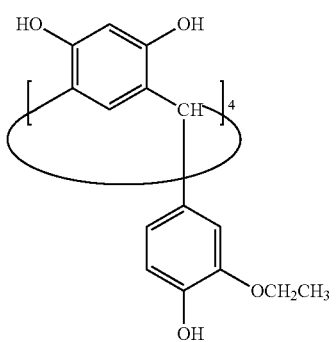 (X-27)
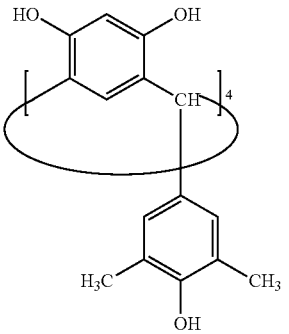 (X-28)
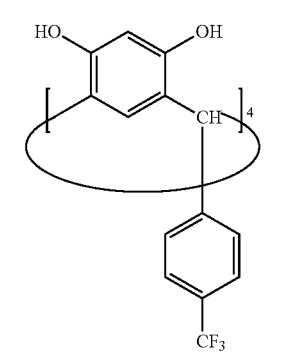 (X-29)
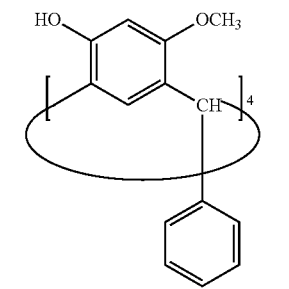 (X-30)
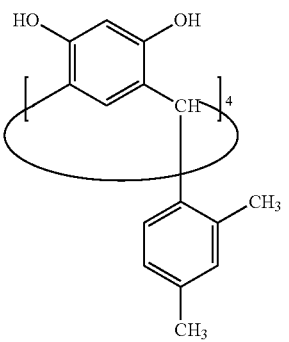 (X-31)
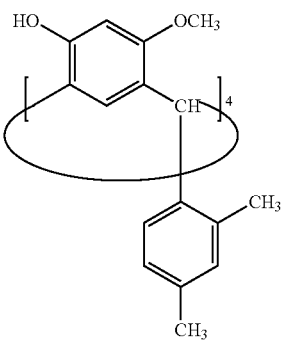 (X-32)

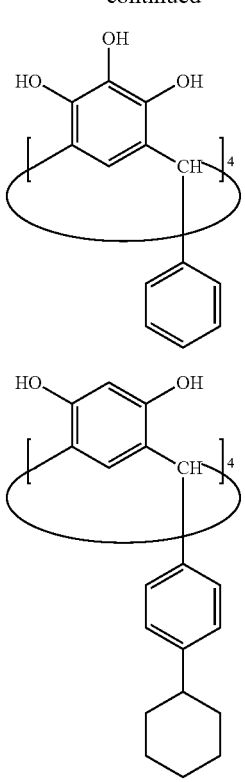

(X-33)

(X-34)

The parent compound of the polyphenol compound (A) is commercially available from Honshu Chemical Industry Co., Ltd., Asahi Organic Chemicals Industry Co., Ltd., etc., and commercially available products can be used. Moreover, the parent compounds can be synthesized by condensation of any phenolic compound, any aldehyde and ketone.

In the negative resist composition of the present invention, among the above-mentioned compounds, one may be used solely or two or more kinds may be used in combination as the polyphenol compound (A). For example, the compound represented by the chemical formula (2) may be mixed with the compound represented by the chemical formula (4), or a compound in which, like the compound represented by the chemical formula (5), all repeating units are identical may be mixed with a compound in which, like the compound represented by the chemical formula (6), all repeating units are different.

The molecular weight of the polyphenol compound (A) is 300 to 3,000.

When the polyphenol compound (A) is the compound represented by the chemical formula (2), the molecular weight is preferably 300 to 2,000, more preferably 400 to 1,500.

When the polyphenol compound (A) is the compound represented by the chemical formula (4), the molecular weight is preferably 300 to 2,500, more preferably 400 to 2,000.

When the polyphenol compound (A) is the compound represented by the chemical formula (2), the content of the polyphenol compound (A) is preferably 50 to 95% by weight of the total solid content, more preferably 60 to 85% by weight.

When the polyphenol compound (A) is the compound represented by the chemical formula (4), the content of the polyphenol compound (A) is preferably 50 to 95% by weight of the total solid content, more preferably 60 to 85% by weight.

In the present invention, "solid content" means the content of components excluding an organic solvent in the negative resist composition.

<Acid Generator (B) which Directly or Indirectly Produces Acid by Exposure to Active Energy Rays Having a Wavelength of 248 nm or Less>

The acid generator (B) which is used in the present invention and directly or indirectly produces acid by exposure to active energy rays having a wavelength of 248 nm or less, can be selected from known acid generators without any particular limitation, which are used for conventional, chemically-amplified resist compositions.

The acid generator (B) is preferably at least one selected from the group consisting of compounds represented by the following chemical formulae (7) to (9).

[Chemical Formula 11]

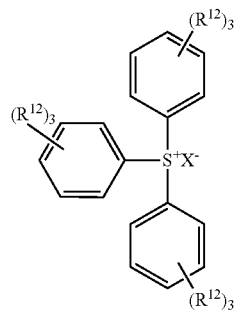

Chemical Formula (7)

In the chemical formula (7), $R^{12}$s may be identical or different and are each independently a hydrogen atom, a linear alkyl group having 1 to 12 carbon atoms, a branched alkyl group having 3 to 12 carbon atoms, a cyclic alkyl group having 3 to 12 carbon atoms, a linear alkoxy group having 1 to 12 carbon atoms, a branched alkoxy group having 3 to 12 carbon atoms, a cyclic alkoxy group having 3 to 12 carbon atoms, a hydroxyl group or a halogen atom; and $X^-$ is a sulfonate ion or halide ion having an alkyl group having 1 to 12 carbon atoms, an aryl group having 6 to 12 carbon atoms, a halogen-substituted alkyl group having 1 to 12 carbon atoms, or a halogen-substituted aryl group having 6 to 12 carbon atoms.

Examples of the compound represented by the chemical formula (7) include triphenylsulfonium trifluoromethylsulfonate, triphenylsulfonium nonafluoro-n-butanesulfonate, triphenylsulfonium cyclohexafluoropropane-1,3-bis(sulfonyl)imide, triphenylsulfonium nonafluorobutanesulfonate, triphenylsulfonium perfluoro-n-octanesulfonate, diphenyl-4-methylphenylsulfonium trifluoromethanesulfonate, diphenyl-2,4,6-trimethylphenylsulfonium trifluoromethanesulfonate, diphenyl-2,4,6-trimethylphenylsulfonium p-toluenesulfonate, diphenyl-4-t-butoxyphenylsulfonium trifluoromethanesulfonate, diphenyl-4-t-butoxyphenylsulfonium nonafluoro-n-butanesulfonate, diphenyl-4-hydroxyphenylsulfonium trifluoromethanesulfonate, bis(4-fluorophenyl)-4-hydroxyphenylsulfonium trifluoromethanesulfonate, diphenyl-4-hydroxyphenylsulfonium nonafluoro-n-butanesulfonate, bis(4-hydroxyphenyl)-phenylsulfonium trifluoromethanesulfonate, tris(4-methoxyphenyl)sulfonium trifluoromethanesulfonate, tris(4-fluorophenyl)sulfonium trifluoromethanesulfonate, triphenylsulfonium-p-toluenesulfonate, triphenylsulfonium benzenesulfonate, diphenyl-2,4,6-trimethylphenyl-p-toluenesulfonate, diphenyl-2,4,6-trimethylphenylsulfonium-2-trifluoromethylbenzenesulfonate, diphenyl-2,4,6-trimethylphenylsulfonium-4-trifluoromethylbenzenesulfonate, diphenyl-2,4,6-trimethylphenylsulfonium-2,4-difluorobenzenesulfonate, diphenyl-2,4,6-trimethylphenylsulfonium hexafluorobenzenesulfonate, diphenylnaphthylsulfonium trifluoromethanesulfonate, diphenyl-4-hydroxyphenylsulfonium-p-toluenesulfonate, triphenylsulfonium 10-camphorsulfonate, and diphenyl-4-hydroxyphenylsulfonium 10-camphorsulfonate.

[Chemical Formula 12]

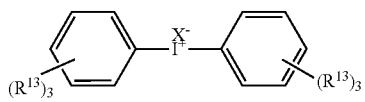

Chemical Formula (8)

In the chemical formula (8), $X^-$ and $R^{13}$ are the same as $X^-$ and $R^{12}$ of the chemical formula (7), respectively.

Examples of the compound represented by the chemical formula (8) include bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium p-toluenesulfonate, bis(4-t-butylphenyl)iodonium benzenesulfonate, bis(4-t-butylphenyl)iodonium-2-trifluoromethylbenzenesulfonate, bis(4-t-butylphenyl)iodonium-4-trifluoromethylbenzenesulfonate, bis(4-t-butylphenyl)iodonium-2,4-difluorobenzenesulfonate, bis(4-t-butylphenyl)iodonium hexafluorobenzenesulfonate, bis(4-t-butylphenyl)iodonium 10-camphorsulfonate, diphenyliodonium trifluoromethanesulfonate, diphenyliodonium nonafluoro-n-butanesulfonate, diphenyliodonium perfluoro-n-octanesulfonate, diphenyliodonium p-toluenesulfonate, diphenyliodonium benzenesulfonate, diphenyliodonium 10-camphorsulfonate, diphenyliodonium-2-trifluoromethylbenzenesulfonate, diphenyliodonium-4-trifluoromethylbenzenesulfonate, diphenyliodonium-2,4-difluorobenzenesulfonate, diphenyliodonium hexafluorobenzenesulfonate, bis(4-trifluoromethylphenyl)iodonium trifluoromethanesulfonate, bis(4-trifluoromethylphenyl)iodonium nonafluoro-n-butanesulfonate, bis(4-trifluoromethylphenyl)iodonium perfluoro-n-octanesulfonate, bis(4-trifluoromethylphenyl)iodonium p-toluenesulfonate, bis(4-trifluoromethylphenyl)iodonium benzenesulfonate, and bis(4-trifluoromethylphenyl)iodonium 10-camphorsulfonate.

[Chemical Formula 13]

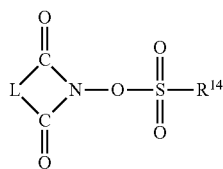

Chemical Formula (9)

In the chemical formula (9), L is an alkylene group having 1 to 12 carbon atoms, an arylene group having 6 to 12 carbon atoms or an alkyleneoxy group having 1 to 12 carbon atoms (—R'—O—; however, R' is an alkylene group having 1 to 12 carbon atoms), and $R^{14}$ is an alkyl group having 1 to 12 carbon atoms, an aryl group having 6 to 12 carbon atoms, a halogen-substituted alkyl group having 1 to 12 carbon atoms, or a halogen-substituted aryl group having 6 to 12 carbon atoms.

Examples of the compound represented by the chemical formula (9) include N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-en-2,3-dicarboximide, N-(trifluoromethylsulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-en-2,3-dicarboximide, N-(10-camphorsulfonyloxy)naphthylimide, N-(n-octanesulfonyloxy)bicyclo[2.2.1]hept-5-en-2,3-dicarboximide, N-(n-octanesulfonyloxy)naphthylimide, N-(p-toluenesulfonyloxy)bicyclo[2.2.1]hept-5-en-2,3-dicarboximide, N-(p-toluenesulfonyloxy)naphthylimide, N-(2-trifluoromethylbenzenesulfonyloxy)bicyclo[2.2.1]hept-5-en-2,3-dicarboximide, N-(2-trifluoromethylbenzenesulfonyloxy)naphthylimide, N-(4-trifluoromethylbenzenesulfonyloxy)bicyclo[2.2.1]hept-5-en-2,3-dicarboximide, N-(4-trifluoromethylbenzenesulfonyloxy)naphthylimide, N-(perfluorobenzenesulfonyloxy)bicyclo[2.2.1]hept-5-en-2,3-dicarboximide, N-(perfluorobenzenesulfonyloxy)naphthylimide, N-(1-naphthalenesulfonyloxy)bicyclo[2.2.1]hept-5-en-2,3-dicarboximide, N-(1-naphthalenesulfonyloxy)naphthylimide, N-(nonafluoro-n-butanesulfonyloxy)bicyclo[2.2.1]hept-5-en-2,3-dicarboximide, N-(nonafluoro-n-butanesulfonyloxy)naphthylimide, N-(perfluoro-n-octanesulfonyloxy)bicyclo[2.2.1]hept-5-en-2,3-dicarboximide, and N-(perfluoro-n-octanesulfonyloxy)naphthylimide.

In addition, acid generators described in paragraphs [0062] to [0071] of International Publication No. WO2009/060869 are also suitable for use.

These acid generators (B) can be used solely or in combination of two or more kinds. The content is preferably 1 to 40 parts by weight, more preferably 1 to 30 parts by weight, still more preferably 5 to 20 parts by weight, with respect to 100 parts by weight of the polyphenol compound (A). If the content is smaller than this range, image formation may be impossible. If the content is larger than this range, no uniform resist solution may be obtained and there may be a decrease in storage stability.

<Crosslinking Agent (C)>

The crosslinking agent (C) used in the present invention is a compound represented by the following chemical formula (1):

[Chemical Formula 14]

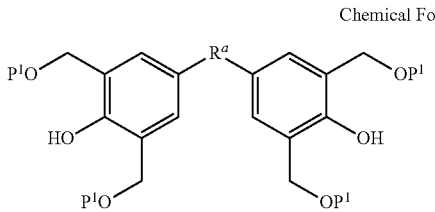

Chemical Formula (1)

wherein $R^a$ is an organic group having 2 to 20 carbon atoms, and $P^1$ is a hydrogen atom or an alkyl group.

In the chemical formula (1), $R^a$ is an organic group having 2 to 20 carbon atoms. Preferred examples thereof include a linear, branched or cyclic alkylene group which has 2 to 20 carbon atoms and may have a substituent, an arylene group which may have a substituent, and an organic group which is a combination thereof, such as an isopropylene group, a cyclohexylene group and a fluorene group. $R^a$ may have an ether bond, a thioether bond, a carbonyl bond, a thiocarbonyl bond, an ester bond, an amide bond, an urethane bond, a carbonate bond, a sulfonyl bond, etc.

Specific examples of $R^a$ also include organic groups represented by the following chemical formulae (1-1) to (1-14):

[Chemical Formula 15]

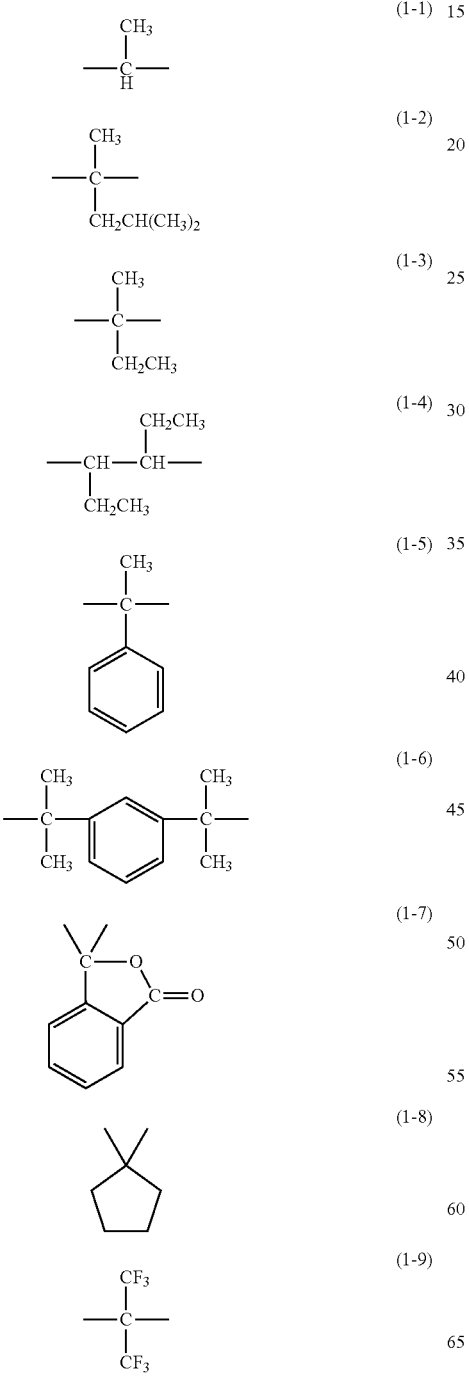

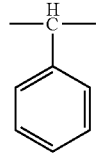

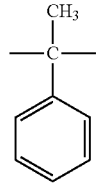

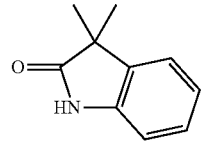

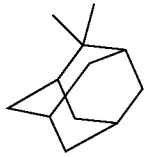

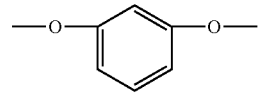

The alkyl group as $P^1$ is preferably one having 6 or less carbon atoms. In particular, there may be mentioned a methyl group, an ethyl group, an n-propyl group, an i-propyl group, an n-butyl group, an i-butyl group, a sec-butyl group, a t-butyl group, etc. Of these, a methyl group is preferable. The alkyl group may have an alkoxy group as a substituent. As the alkoxy group as the substituent, there may be mentioned a methoxy group and an ethoxy group, for example.

Specific examples of the compound represented by the chemical formula (1) are shown below. However, the present invention is not limited thereto.

[Chemical Formula 16]

Chemical Formula (1-A)

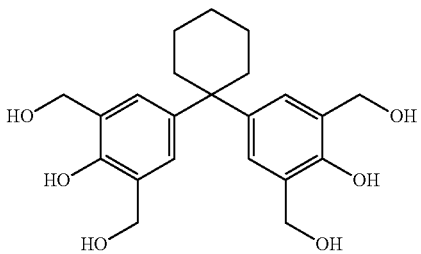

Chemical Formula (1-B)
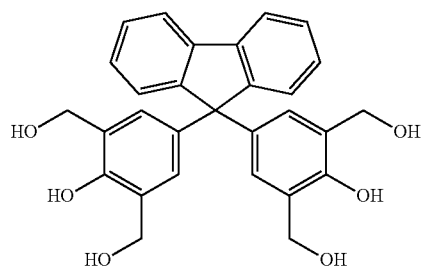
Chemical Formula (1-C)
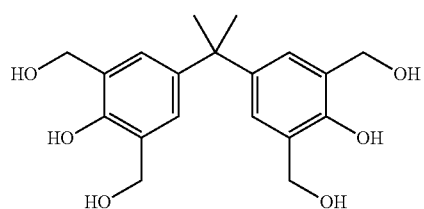
Chemical Formula (1-D)
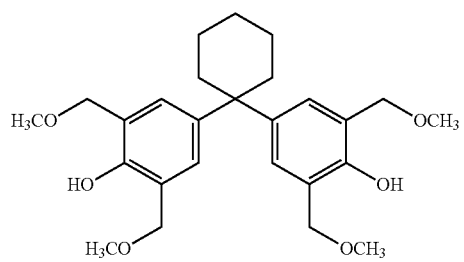
Chemical Formula (1-E)
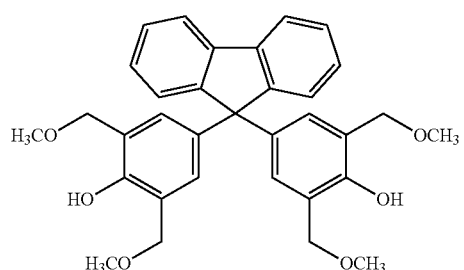
Chemical Formula (1-F)
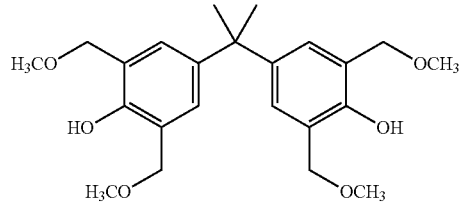
Chemical Formula (1-G)
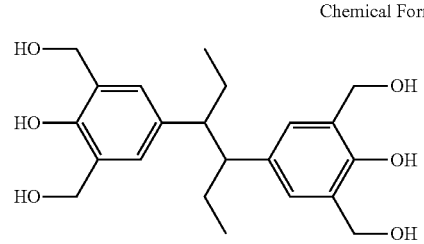
Chemical Formula (1-H)
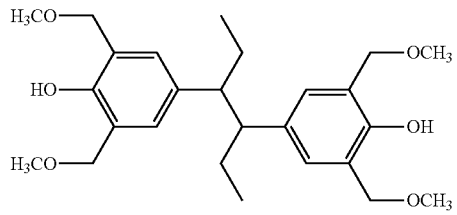
Chemical Formula (1-I)
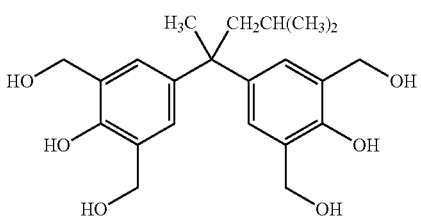
Chemical Formula (1-J)
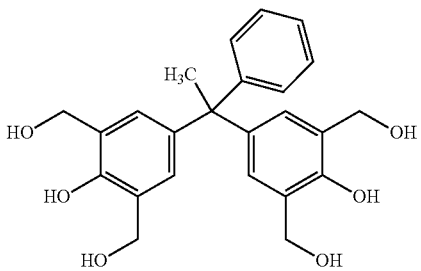
Chemical Formula (1-K)
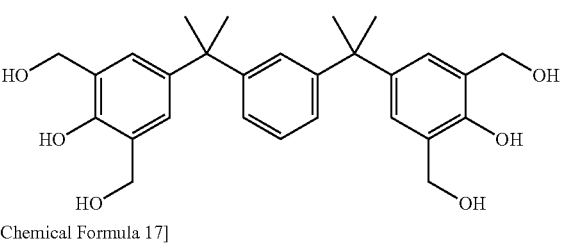
[Chemical Formula 17]
Chemical Formula (1-L)
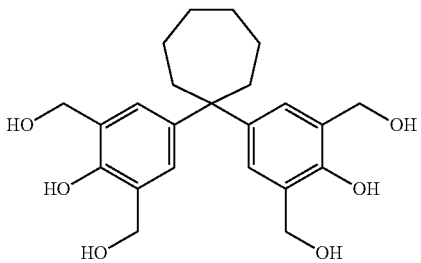
Chemical Formula (1-M)
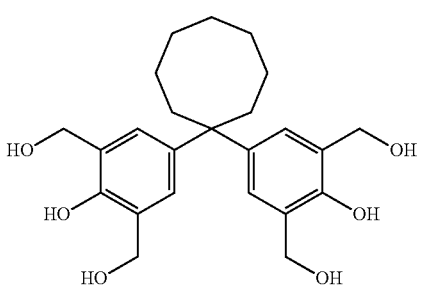

Chemical Formula (1-N)

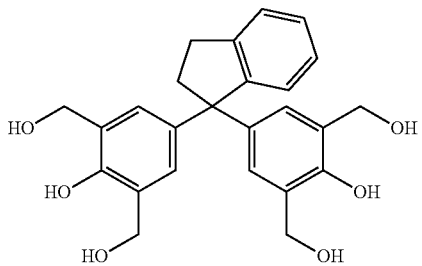

Chemical Formula (1-O)

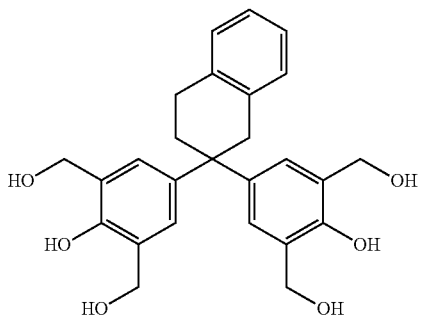

Chemical Formula (1-P)

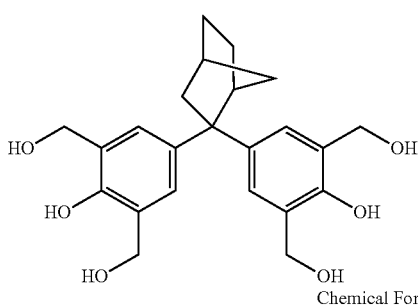

Chemical Formula (1-Q)

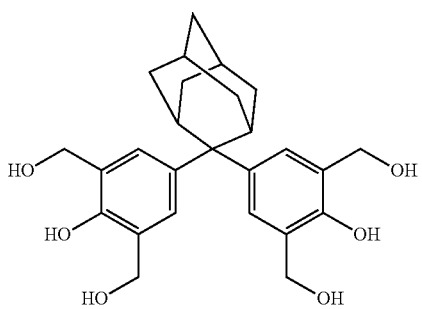

Of the compounds represented by the chemical formula (1), the bisphenol derivative having a hydroxymethyl group can be obtained by the reaction of a corresponding bisphenol compound having no hydroxymethyl group with formaldehyde in the presence of a base catalyst. The various bisphenol derivatives having an alkoxymethyl group can be obtained by the reaction of corresponding bisphenol derivatives having a hydroxymethyl group with alcohol in the presence of an acid catalyst.

The crosslinking agent (C) used in the present invention is preferably a compound represented by the following chemical formula (A) in which $R^a$ is an organic group represented by the following chemical formula (a), from the viewpoint of obtaining a well-shaped pattern with high sensitivity and high resolution and from the viewpoint of adhesion:

[Chemical Formula 18]

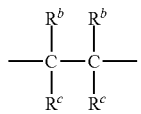

Chemical Formula (a)

wherein each $R^b$ is independently an alkyl group having 1 to 5 carbon atoms, and each $R^c$ is independently a hydrogen atom or an alkyl group having 1 to 5 carbon atoms.

[Chemical Formula 19]

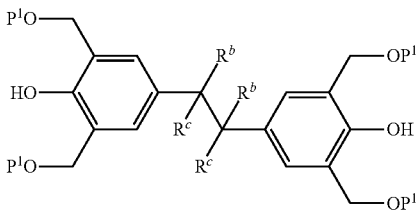

Chemical Formula (A)

wherein each $R^b$ is independently an alkyl group having 1 to 5 carbon atoms; each $R^c$ is independently a hydrogen atom or an alkyl group having 1 to 5 carbon atoms; and $P^1$ is the same as the chemical formula (1).

The alkyl group having 1 to 5 carbon atoms as $R^b$ and $R^c$ can be linear or branched. Examples of the linear alkyl group include a methyl group, an ethyl group, an n-propyl group, an n-butyl group and an n-pentyl group. Examples of the branched alkyl group include an i-propyl group, an i-butyl group and a t-butyl group. As $R^b$, a methyl group and an ethyl group are particularly preferable. As $R^c$, a hydrogen atom is particularly preferable.

Two $R^b$s contained in a molecule may be identical or different, and two $R^c$s contained in a molecule may be identical or different.

As the organic group represented by the chemical formula (a), the organic group represented by the chemical formula (1-4) as $R^a$ is preferable. As the compound represented by the chemical formula (A), the compounds represented by the above-mentioned chemical formula (1-G) and (1-H) are preferable.

The compounds represented by the chemical formula (1) (crosslinking agent (C)) may be used solely or in combination of two or more kinds. The content is 3 to 40 parts by weight, preferably 3 to 30 parts by weight, with respect to 100 parts by weight of the polyphenol compound (A). If the content of the crosslinking agent (C) is less than 3 parts by weight, insufficient crosslinking may proceed and thus no excellent resist pattern could be obtained. If the content exceeds 40 parts by weight, there may be a decrease in storage stability of the resist solution and thus there may be a deterioration in sensitivity of the same over time.

<Organic Basic Compound (D)>

The organic basic compound (D) used in the present invention can be optionally selected from known organic basic compounds to improve resist pattern shape and to increase temporal stability during storage.

As the organic basic compound (D), for example, there may be mentioned nitrogen-containing organic compounds such as a nitrogen-containing compound having a nitrogen atom, an amide group-containing compound, a urea compound and a nitrogen-containing heterocyclic compound. However, the organic basic compound (D) is not limited to these examples.

Examples of the nitrogen-containing organic compounds include tri(cyclo)alkylamines such as tri-n-butylamine, tri-n-pentylamine, tri-n-hexylamine, tri-n-heptylamine, tri-n-octylamine, tri-n-nonylamine, tri-n-decylamine, dimethyl-n-dodecylamine, di-n-dodecylmethylamine, dicyclohexylmethylamine and tricyclohexylamine; alkanolamines such as monoethanolamine, diethanolamine and triethanolamine; aromatic amines such as aniline, N-methylaniline, N,N-dimethylaniline, 2-methylaniline, 3-methylaniline, 4-methylaniline, 4-nitroaniline, diphenylamine, triphenylamine, tribenzylamine and 1-naphthylamine; and ethylenediamine, N,N,N',N'-tetramethylethylenediamine, N,N,N',N'-tetrakis(2-hydroxypropyl) ethylenediamine, tetramethylenediamine, hexamethylenediamine, 4,4'-diaminodiphenylmethane, 4,4'-diaminodiphenylether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, polyethyleneimine, 2,2-(phenylimino)diethanol, polyallylamine and a polymer of N-(2-dimethylaminoethyl)acrylamide.

Examples of the nitrogen-containing heterocyclic compound include imidazoles such as imidazole, benzimidazole, 4-methylimidazole, 4-methyl-2-phenylimidazole, 2-phenylbenzimidazole, 4,5-diphenylimidazole and 2,4,5-triphenylimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinic acid amide, quinoline, 8-oxyquinoline and acridine; and pyrazine, pyrazole, pyridazine, quinozaline, purine, pyrrolidine, piperidine, morpholine, 4-methylmorpholine, piperazine, 1,4-dimethylpiperazine and 1,4-diazabicyclo[2.2.2]octane.

These organic basic compounds (D) can be used solely or in combination of two or more kinds. The content of the organic basic compound (D) is 0.01 to 10 parts by weight, preferably 0.1 to 5 parts by weight, with respect to 100 parts by weight of the polyphenol compound (A). If the content is less than 0.01 part by weight, no effect is obtained by the addition of the organic basic compound (D). On the other hand, if the content exceeds 10 parts by weight, there tends to be a decrease in sensitivity or a deterioration in developing properties of the unexposed portion.

<Other Components>

As need, the negative resist composition of the present invention can be appropriately mixed with miscible additives such as an additional resin for improving resist film performance, such as alkali-soluble polymers as described in paragraph [0080] to [0098] of International Publication No. WO2009/060869, a surfactant for increasing coatability, a dissolution inhibitor, a plasticizer, a stabilizing agent, a colorant, a halation inhibitor, etc.

<Preparation of Negative Resist Composition>

In general, the negative resist composition of the present invention is prepared by uniformly mixing an organic solvent with the above-described polyphenol compound (A), acid generator (B), crosslinking agent (C) and, as needed, other additives.

As the organic solvent, those that are generally used as the solvents for chemically amplified resists can be used. For example, preferred are cyclohexanone, cyclopentanone, 2-heptanone, γ-butyrolactone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, propylene glycol monomethyl ether propionate, diethylene glycol dimethyl ether, toluene, methyl lactate, ethyl lactate, methyl methoxypropionate, ethyl ethoxypropionate, methyl pyruvate, ethyl pyruvate and propyl pyruvate. These solvents can be used solely or in combination. In addition, the resist composition can contain an alcohol such as n-butyl alcohol, s-butyl alcohol, t-butyl alcohol, isobutyl alcohol, 2-methyl-1-pentanol, 4-methyl-2-pentanol, 2-methoxyethanol, 2-ethoxyethanol, 1-ethoxy-2-propanol and 1-methoxy-2-propanol. Among these organic solvents, suitably used in the present invention are those that have the best ability to dissolve the acid generator in the resist component, such as diethylene glycol dimethyl ether, cyclohexanone, cyclopentanone, 1-ethoxy-2-propanol and ethyl lactate; moreover, propylene glycol monomethyl ether and propylene glycol monomethyl ether acetate, which are safety solvents, and a mixed solvent thereof are suitably used.

The amount of the solvent in the resist composition is not particularly limited and is appropriately determined according to the concentration which makes the resist composition applicable to a substrate, etc., and depending on the thickness of the composition applied. In general, the solvent is used so that the resist composition has a solid content concentration preferably in the range of 0.5 to 20% by weight, more preferably in the range of 0.5 to 15% by weight.

II. Pattern Forming Method

The pattern forming method of the present invention comprises the steps of:

(i) forming a resist film by applying the negative resist composition of the present invention to a substrate and heating the same, and (ii) exposing the resist film to electron beams, EUV or x-rays, heating the resist film and then developing the same.

A well-shaped pattern with high sensitivity and high resolution is formed by the pattern forming method of the present invention.

[Step (i)]

In this step, first, the negative resist composition is applied onto a substrate.

The coating method is not particularly limited as long as it is a method that can uniformly apply the negative resist composition onto the substrate surface.

Various methods are usable, such as a spraying method, a roll coating method, a slit coating method and a spin coating method.

Next, post-applied bake (PAB) is performed on the negative resist composition applied onto the substrate to remove the organic solvent, thereby forming a resist film.

The temperature of the post-applied bake can be appropriately determined depending on the components of the composition, the amount of the components and the type of the organic solvent, etc. The temperature is normally 70 to 160° C., preferably 70 to 150° C. The time of the post-applied bake is normally about 30 seconds to 15 minutes.

[Step (ii)]

In this step, first, the resist film is selectively exposed to light by exposure to light through a mask with a predetermined pattern or by direct writing with exposure to electron beams which is not through the mask, using an exposure system such as an electron beam lithography system or EUV exposure system.

The exposure source is not particularly limited and there may be used ArF excimer laser, KrF excimer laser, $F_2$ excimer laser, extreme ultraviolet (EUV), electron beams, x-rays, etc.

After the exposure, post exposure bake (PEB) is performed. The PEB treatment condition is normally a temperature of 50 to 160° C. and a time of 0.1 to 15 minutes.

Next, the PEB-treated substrate is developed with an alkali developing solution to remove an unexposed portion which was not exposed to the exposure light.

As the developing method, there may be mentioned a spraying method, a slitting method, a puddle developing method, a dipping method, a vibration dipping method, etc.

As the alkali developing solution of the negative resist composition of the present invention, for example, aqueous solutions of alkalis are usable, including: inorganic alkalis such as sodium hydroxide, potassium hydroxide, sodium carbonate, sodium silicate, sodium metasilicate and ammonium water; primary amines such as ethylamine and n-propylamine; secondary amines such as diethylamine and di-n-butylamine; tertiary amines such as triethylamine and methyldimethylamine; alcohol amines such as dimethylethanolamine and triethanolamine; quaternary ammonium salts such as tetramethylammonium hydroxide, tetraethylammonium hydroxide and choline; and cyclic amines such as pyrrole and piperidine. Also, these alkaline aqueous solutions can mixed with an appropriate amount of alcohol such as isopropyl alcohol or an appropriate amount of surfactant such as nonionic surfactant. Among these alkali developing solutions, solutions of quaternary ammonium salts are preferable, and aqueous solutions of tetramethylammonium hydroxide and choline are more preferable.

In the case of using a tetramethylammonium hydroxide (TMAH) aqueous solution as the alkali developing solution, the tetramethylammonium hydroxide aqueous solution preferably has a concentration of 0.1% to 5%, more preferably 0.5% to 3%, particularly preferably 1.19% to 2.38%. In general, a tetramethylammonium hydroxide aqueous solution having a concentration of 2.38% is the easiest to obtain in the semiconductor industry. If the tetramethylammonium hydroxide aqueous solution has a concentration of less than 0.1%, the developing solution may be neutralized by carbon dioxide in the air; therefore, there may be a change in sensitivity and thus it is difficult to stably obtain products.

After the developing treatment, a rinsing treatment is performed to rinse off the alkali developing solution on the substrate and the resist composition dissolved by the solution, followed by drying, thereby obtaining a resist pattern.

The present invention is not limited to the above-mentioned embodiments. The above-mentioned embodiments are examples, and any that has the substantially same essential features as the technical ideas described in claims of the present invention and exerts the same effects and advantages is included in the technical scope of the present invention.

EXAMPLES

Hereinafter, the present invention will be explained in more detail by way of examples. The scope of the present invention is not restricted by these examples, however. The structure of the thus-obtained crosslinking agent compounds were confirmed by $^1$H-NMR spectra. Analysis results are shown in Table 1.

Synthesis Example 1

Sodium hydroxide of 1.6 g (40 mmol) was dissolved in water of 10 mL. Bisphenol Z of 2.7 g (10 mmol) and ethanol of 10 mL were added thereto and stirred to dissolve. To this solution, a 37% formalin aqueous solution of 14.0 mL (160 mmol) was added slowly for 30 minutes at room temperature. Under nitrogen atmosphere, the solution was stirred at 40° C. for 13 hours and then poured into 200 mL water in a beaker. With cooling the beaker in an ice bath, a 2.0 wt % acetic acid aqueous solution was slowly added so that the mixed solution is pH 5.0. The resulting precipitate was collected by filtration, washed thoroughly with water and then dried. Purification was performed by high-performance liquid chromatography, thereby obtaining 2.9 g of a white compound of bisphenol Z derivative (CL-01) which is represented by the following chemical formula (1-A) and has a hydroxymethyl group:

[Chemical Formula 20]

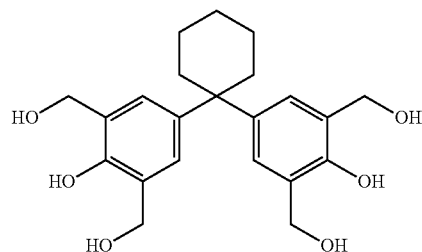

Chemical Formula (1-A)

Synthesis Example 2

Crosslinking agent compound 2 (CL-02) represented by the following chemical formula (1-B) was synthesized in the same manner as the production method of synthesis example 1, except that 9,9-bis(4-hydroxyphenyl)fluorene of 3.5 g (10 mmol) was used as the bisphenol compound. As a result, a white compound of 3.9 g was obtained.

[Chemical Formula 21]

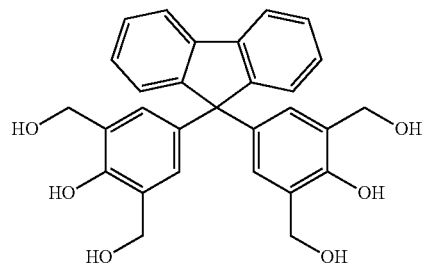

Chemical Formula (1-B)

Crosslinking agent compound 3 (CL-03) which is 2,2-bis (4-hydroxy-3,5-dihydroxymethylphenyl)propane represented by the following chemical formula (1-C), was obtained from Asahi Organic Chemicals Industry Co., Ltd.:

[Chemical Formula 22]

Chemical Formula (1-C)

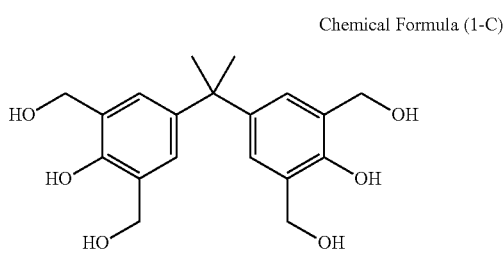

Synthesis Example 3

2,2-bis(4-hydroxy-3,5-dihydroxymethylphenyl)propane represented by the chemical formula (1-C) of 5.0 g (14.6 mmol) was added to methanol of 250 mL and dissolved by stirring with heating. Concentrated sulfuric acid of 0.25 mL was added to the solution and heated to reflux for 15 hours. After reaction completion, the resulting reaction solution was cooled and potassium carbonate of 1.0 g was added thereto. After the solution was concentrated, ethyl acetate of 300 mL was added thereto. This solution was washed three times with water and then concentrated, thereby obtaining 4.7 g of a white compound of crosslinking agent compound 4 (CL-04) represented by the following formula (1-F):

[Chemical Formula 23]

Chemical Formula (1-F)

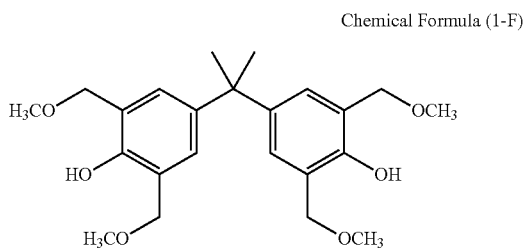

Synthesis Example 4

Crosslinking agent compound 5 (CL-05) represented by the following chemical formula (1-G) was synthesized in the same manner as the production method of synthesis example 1, except that 4,4'-(1,2-diethylethylene)diphenol of 2.7 g (10 mmol) was used as the bisphenol compound. As a result, a white compound of 3.3 g was obtained.

[Chemical Formula 24]

Chemical Formula (1-G)

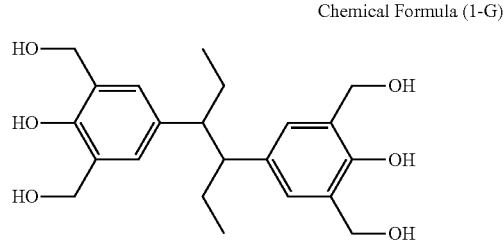

Synthesis Example 5

Crosslinking agent compound 6 (CL-06) represented by the following chemical formula (1-I) was synthesized in the same manner as the production method of synthesis example 1, except that 4,4'-(1,3-dimethylbutylidene)diphenol of 2.7 g (10 mmol) was used as the bisphenol compound. As a result, a white compound of 3.4 g was obtained.

[Chemical Formula 25]

Chemical Formula (1-I)

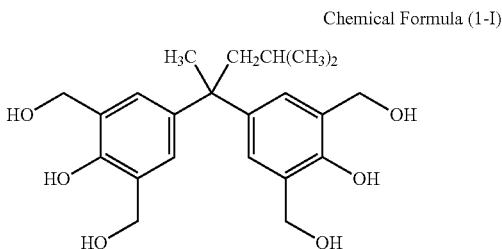

Synthesis Example 6

Crosslinking agent compound 7 (CL-07) represented by the following chemical formula (1-J) was synthesized by the same manner as the production method of synthesis example 1, except that 4,4'-(α-methylbenzylidene)bisphenol of 2.9 g (10 mmol) was used as the bisphenol compound. As a result, a white compound of 3.6 g was obtained.

[Chemical Formula 26]

Chemical Formula (1-J)

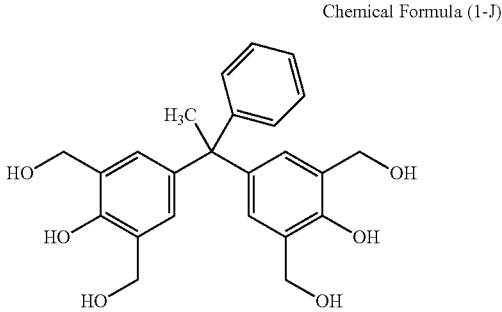

Synthesis Example 7

Crosslinking agent compound 8 (CL-08) represented by the following chemical formula (1-K) was synthesized in the same manner as the production method of synthesis example 1, except that 1,3-bis[2-(4-hydroxyphenyl)-2-propyl] benzene of 3.5 g (10 mmol) was used as the bisphenol compound. As a result, a white compound of 4.6 g was obtained.

[Chemical Formula 27]

Chemical Formula (1-K)

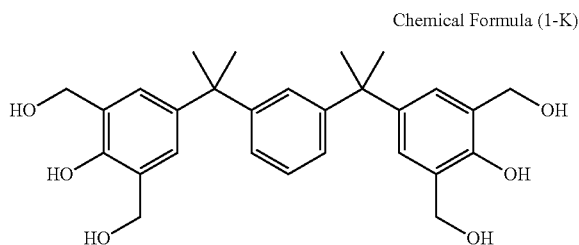

[Chemical Formula 30]

Chemical Formula (16)

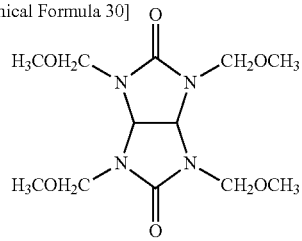

TABLE 1

| | Compound | $^1$H-NMR | Purity (%) |
|---|---|---|---|
| Synthesis Example 1 | CL-01 | 8.3 (2H, —OH), 7.0 (4H, PhH), 5.2 (4H, CH$_2$—OH) 4.5 (8H, —CH$_2$—), 2.5 (4H, —CH$_2$—), 1.4 (6H, —CH$_2$—) | 97 |
| Synthesis Example 2 | CL-02 | 8.4 (2H, —OH), 7.9-6.9 (12H, PhH), 5.1 (4H, CH$_2$—OH) 4.5 (8H, —CH$_2$—) | 96 |
| Synthesis Example 3 | CL-04 | 8.3 (2H, —OH), 7.0 (4H, PhH), 4.4 (8H, —CH$_2$—) 3.2 (12H, —OCH$_3$), 1.5 (6H, —CH$_3$) | 100 |
| Synthesis Example 4 | CL-05 | 8.4 (2H, —OH), 7.0 (4H, PhH), 5.3 (4H, CH$_2$—OH) 4.6 (8H, —CH$_2$—OH), 2.4 (2H, —CH—), 1.2 (4H, —CH$_2$—) 0.4 (6H, —CH$_3$) | 100 |
| Synthesis Example 5 | CL-06 | 8.3 (2H, —OH), 7.0 (4H, PhH), 5.2 (4H, CH$_2$—OH) 4.4 (8H, —CH$_2$—OH), 2.0 (2H, —CH$_2$—), 1.5 (3H, —CH$_3$) 1.4 (1H, —CH—), 0.7 (6H, —CH$_3$) | 98 |
| Synthesis Example 6 | CL-07 | 8.4 (2H, —OH), 7.3-7.0 (5H, PhH), 6.9 (4H, PhH) 5.2 (4H, —CH$_2$—OH), 4.5 (8H, —CH$_2$—), 2.0 (3H, —CH$_3$) | 98 |
| Synthesis Example 7 | CL-08 | 8.4 (2H, —OH), 7.2-6.9 (8H, PhH), 5.2 (4H, CH$_2$—OH), 4.5 (8H, —CH$_2$—OH), 1.5 (12H, —CH$_3$) | 99 |

Comparative Synthesis Example 1

Crosslinking agent compound 9 (CL-09) which is 4,4'-methylenebis[2,6-bis(hydroxymethyl)]phenol represented by the following chemical formula (14), was synthesized according to non-patent literature 3 (J. Imaging Sci. Technol., 36, 5, (1992)):

[Chemical Formula 28]

Chemical Formula (14)

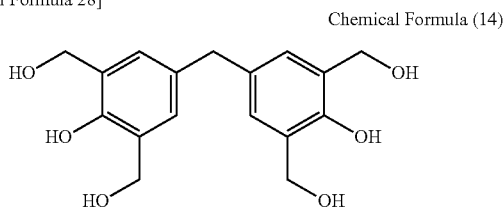

crosslinking agent compound 10 (CL-10) which is NIKA-LAC MW-30HM represented by the following chemical formula (15), was obtained from SANWA Chemical Co., Ltd.:

[Chemical Formula 29]

Chemical Formula (15)

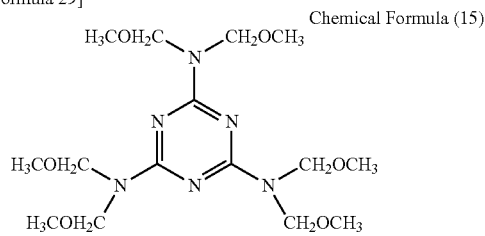

Crosslinking agent compound 11 (CL-11) which is NIKA-LAC MX-270 represented by the following chemical formula (16), was obtained from SANWA Chemical Co., Ltd.:

Synthesis Example 8

Under nitrogen atmosphere, 3-methoxyphenol of 12.4 g (0.1 mol) was dissolved in ethanol of 200 mL in a 300 mL three-necked flask. With cooling the flask in an ice bath, 2,4-dimethylbenzaldehyde of 13.4 g (0.1 mol) was added thereto. Then, concentrated hydrochloric acid of 25 mL was added thereto slowly and dropwise and reacted at 70° C. for 12 hours. After reaction completion, the resulting reaction solution was poured into distilled water of 500 mL, and the thus-produced precipitate (yellow solid) was collected by filtration. The precipitate was washed with water until it is neutralized, and then dried. Purification was performed by high-performance liquid chromatography, thereby obtaining a white compound 1 (CRA-01) represented by the following chemical formula (2-A). The structure of the compound was confirmed by electrospray ionization mass spectrometry (ESI-MS) and $^1$H-NMR spectrum. The glass transition temperature of the compound was 200° C. or more. That is, no glass transition temperature was observed and no boiling point was observed at 200° C. or less.

[Chemical Formula 31]

Chemical Formula (2-A)

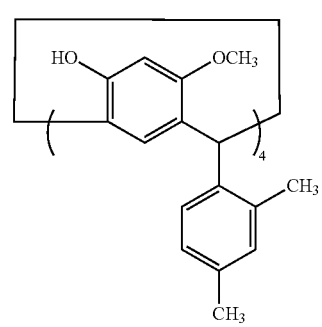

Synthesis Examples 9 to 15

Compounds 2 (CRA-02) to 8 (CRA-08) were synthesized by the production method of synthesis example 8, using materials shown in Table 2. The used materials, the thus-obtained compounds and their glass transition temperatures are shown in Table 2. In this table, the glass transition temperature of the compound for which no glass transition temperature was observed and for which no boiling point was observed at 200° C. or less, is described as "200° C. or more".

TABLE 2

| | Resorcinol Derivative | Aldehyde Derivative | Calix Resorcinarene Derivative | Glass Transition Temperature Tg (° C.) |
|---|---|---|---|---|
| CRA-02 | HO–C6H4–OCH3 | 2,4,5-trimethylbenzaldehyde (H3C, CH3, CH3, CHO) | calix[4]resorcinarene with OCH3 and trimethylphenyl groups | 200° C. or more |
| CRA-03 | HO–C6H4–OH | CH3CHO | calix[4]resorcinarene with OH groups and CH3 | 200° C. or more |
| CRA-04 | HO–C6H4–OH | C6H5–CHO | calix[4]resorcinarene with OH groups and phenyl | 200° C. or more |
| CRA-05 | pyrogallol (HO, OH, OH) | C6H5–CHO | calix[4]resorcinarene with three OH groups and phenyl | 200° C. or more |
| CRA-06 | HO–C6H4–OCH3 | C6H5–CHO | calix[4]resorcinarene with OH, OCH3 and phenyl | 200° C. or more |

TABLE 2-continued

| | Resorcinol Derivative | Aldehyde Derivative | Calix Resorcinarene Derivative | Glass Transition Temperature Tg (° C.) |
|---|---|---|---|---|
| CRA-07 | HO–⌬–OCH$_2$CH$_3$ | CH$_3$–⌬(CH$_3$)–CHO | HO–⌬(OCH$_2$CH$_3$)–[...]$_4$–⌬(CH$_3$)(CH$_3$) | 200° C. or more |
| CRA-08 | HO–⌬–OCH$_2$CH$_3$ | OCH$_3$–⌬–CHO | HO–⌬(OCH$_2$CH$_3$)–[...]$_4$–⌬–OCH$_3$ | 200° C. or more |

Polyphenol compound (A-01) represented by the following chemical formula (17) was obtained from Asahi Organic Chemicals Industry Co., Ltd. It has a glass transition temperature of 290° C.

[Chemical Formula 32]

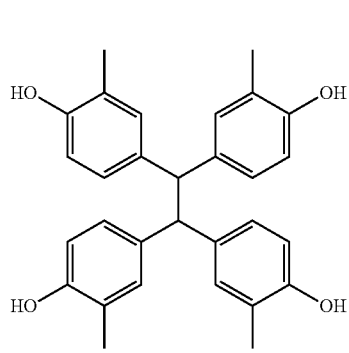

Chemical Formula (17)

Polyphenol compound (A-02) represented by the following chemical formula (18) was obtained from Asahi Organic Chemicals Industry Co., Ltd. It has a glass transition temperature of 268° C.

[Chemical Formula 33]

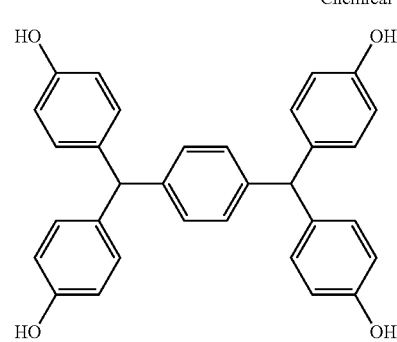

Chemical Formula (18)

Polyphenol compound (A-03) represented by the following chemical formula (19) was obtained from Asahi Organic Chemicals Industry Co., Ltd. It has a glass transition temperature of 219° C.

[Chemical Formula 34]

Chemical Formula (19)

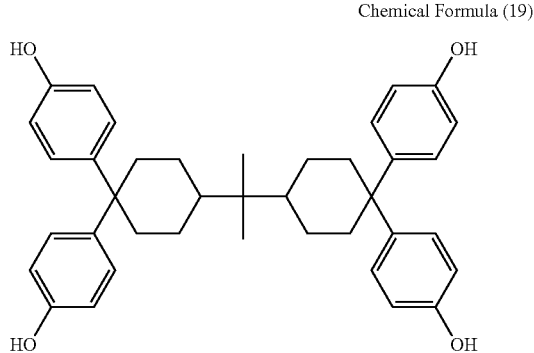

Alkali soluble polymer (E-01) represented by the following chemical formula (20) [poly(4-vinylphenol-co-methyl methacrylate), weight average molecular weight (Mw): 10,000 or less] was purchased from Sigma-Aldrich-Corporation:

[Chemical Formula 35]

Chemical Formula (20)

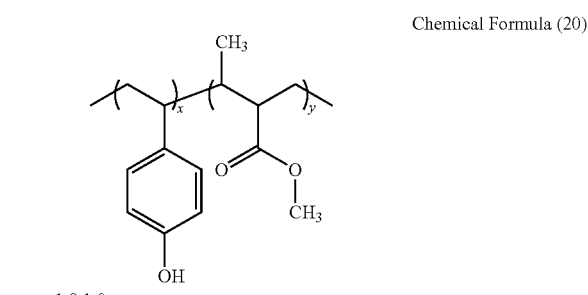

x:y = 1.8:1.0

Examples 1 to 33 and Comparative Examples 1 to 7

Polyphenol compound (A), acid generator (B), crosslinking agent (C), basic compound (D), alkali-soluble polymer (E) and organic solvent (F) were mixed in the amounts shown in Tables 3 and 4 to produce homogenous solutions. Each of the sample solutions was filtered with a 0.1 μm Teflon™ filter to prepare the negative resist composition of the present invention.

The meaning of abbreviations shown in Tables 3 and 4 are as follows:
(B)-1: Triphenylsulfonium trifluoromethylsulfonate
(B)-2: Diphenyl-2,4,6-trimethylphenylsulfonium p-toluenesulfonate
(B)-3: Triphenylsulfonium cyclohexafluoropropane 1,3-bis (sulfonyl)imide
(D)-1: Tri-n-octylamine
(D)-2: Tribenzylamine
(D)-3: 2,4,5-Triphenylimidazole
(D)-4: 2,2-(Phenylimino)diethanol
(E)-1: Poly(4-vinylphenol-co-methyl methacrylate)
(F)-1: Cyclopentanone
(F)-2: Propylene glycol monomethyl ether
Developing Solution: Tetramethylammonium Hydroxide Aqueous Solution <Resist Pattern Formation and Evaluation Method>

Using the resist compositions obtained in the above-described Examples 1 to 33 and Comparative Examples 1 to 7, resist patterns were formed and evaluated by the methods described below. The results are shown in Table 5.

(1) Application of Resist

Each resist composition was uniformly applied onto a 6 inch silicon substrate with a spinner and a post applied baking (PAB) treatment was performed thereon at 100° C. for 60 seconds, thereby forming a resist film having a thickness of 50 nm.

(2) Formation of Resist Pattern

Each resist film was subjected to writing with an electron beam lithography system (accelerating voltage: 100 KeV). After the writing was completed, each film was subjected to a post exposure bake (PEB) treatment at 100° C. for 60 seconds, developed in a TMAH aqueous solution (23° C.) for 60 seconds, and then rinsed with pure water for 60 seconds, thereby forming a line and space (L/S) pattern.

(3) Evaluation Method

[Sensitivity and Resolution]

In the present invention, sensitivity is the minimum exposure amount at which a 100 nm L/S pattern is formed at 1:1, and it was measured in $\mu C/cm^2$. Resolution is the limiting resolution at the minimum exposure amount (lines and spaces are separately resolved). Confirmation of the resolution was determined with a critical dimension-scanning electron microscope (SEM) manufactured by HOLON Co., Ltd.

In the present invention, evaluation was carried out on the ground that high sensitivity is 200 $\mu C/cm^2$ or less and high resolution is 32 nm or less.

TABLE 3

| | Polyphenol Compound (A) | | Acid Generator (B) | | Crosslinking Agent (C) | | Organic Basic Compound (D) | | Alkali Soluble Polymer (E) | | Organic Solvent (F) | | Developing Solution |
|---|---|---|---|---|---|---|---|---|---|---|---|---|---|
| | | Amount (g) | | Amount (g) | | Amount (g) | | Amount (g) | | Amount (g) | | Amount (g) | Concentration (%) |
| Example 1 | CRA-01 | 0.2 | (B)-1 | 0.02 | CL-01 | 0.03 | (D)-1 | 0.002 | — | — | (F)-1 | 15 | 2.38 |
| Example 2 | CRA-01 | 0.2 | (B)-1 | 0.02 | CL-01 | 0.03 | (D)-1 | 0.002 | (E)-1 | 0.002 | (F)-1 | 15 | 2.38 |
| Example 3 | CRA-01 | 0.2 | (B)-1 | 0.02 | CL-01 | 0.03 | (D)-1 | 0.002 | — | — | (F)-2 | 15 | 2.38 |
| Example 4 | CRA-01 | 0.2 | (B)-2 | 0.02 | CL-01 | 0.03 | (D)-1 | 0.002 | — | — | (F)-2 | 15 | 2.38 |
| Example 5 | CRA-01 | 0.2 | (B)-3 | 0.02 | CL-01 | 0.03 | (D)-1 | 0.002 | — | — | (F)-2 | 15 | 2.38 |
| Example 6 | CRA-01 | 0.2 | (B)-1 | 0.02 | CL-01 | 0.03 | (D)-1 | 0.004 | — | — | (F)-2 | 15 | 2.38 |
| Example 7 | CRA-01 | 0.2 | (B)-1 | 0.02 | CL-01 | 0.03 | (D)-1 | 0.004 | — | — | (F)-2 | 15 | 2.38 |
| | | | (B)-2 | 0.02 | | | (D)-1 | | | | | | |
| Example 8 | CRA-01 | 0.2 | (B)-1 | 0.02 | CL-02 | 0.03 | (D)-1 | 0.002 | — | — | (F)-1 | 15 | 2.38 |
| Example 9 | CRA-01 | 0.2 | (B)-1 | 0.02 | CL-03 | 0.03 | (D)-1 | 0.002 | — | — | (F)-1 | 15 | 2.38 |
| Example 10 | CRA-01 | 0.2 | (B)-1 | 0.02 | CL-03 | 0.03 | (D)-1 | 0.002 | — | — | (F)-2 | 15 | 2.38 |

TABLE 3-continued

| | Polyphenol Compound (A) | | Acid Generator (B) | | Crosslinking Agent (C) | | Organic Basic Compound (D) | | Alkali Soluble Polymer (E) | | Organic Solvent (F) | | Developing Solution |
|---|---|---|---|---|---|---|---|---|---|---|---|---|---|
| | | Amount (g) | | Amount (g) | | Amount (g) | | Amount (g) | | Amount (g) | | Amount (g) | Concentration (%) |
| Example 11 | CRA-01 | 0.2 | (B)-1 | 0.02 | CL-04 | 0.03 | (D)-1 | 0.002 | — | — | (F)-2 | 15 | 2.38 |
| Example 12 | CRA-01 | 0.2 | (B)-1 | 0.02 | CL-05 | 0.03 | (D)-1 | 0.002 | — | — | (F)-2 | 15 | 2.38 |
| Example 13 | CRA-01 | 0.2 | (B)-1 | 0.02 | CL-06 | 0.03 | (D)-1 | 0.002 | — | — | (F)-2 | 15 | 2.38 |
| Example 14 | CRA-01 | 0.2 | (B)-1 | 0.02 | CL-07 | 0.03 | (D)-1 | 0.002 | — | — | (F)-2 | 15 | 2,38 |
| Example 15 | CRA-01 | 0.2 | (B)-1 | 0.02 | CL-08 | 0.03 | (D)-1 | 0.002 | — | — | (F)-2 | 15 | 2.38 |
| Example 16 | CRA-01 | 0.2 | (B)-1 | 0.02 | CL-08 | 0.03 | (D)-1 | 0.004 | — | — | (F)-2 | 15 | 2.38 |
| Example 17 | CRA-01 | 0.2 | (B)-1 (B)-2 | 0.02 0.02 | CL-08 | 0.03 | (D)-1 | 0.004 | — | — | (F)-2 | 15 | 2.38 |
| Example 18 | CRA-01 | 0.2 | (B)-1 | 0.02 | CL-01 | 0.03 | (D)-2 | 0.002 | — | — | (F)-2 | 15 | 2.38 |
| Example 19 | CRA-01 | 0.2 | (B)-1 | 0.02 | CL-01 | 0.03 | (D)-3 | 0.002 | — | — | (F)-2 | 15 | 2.38 |
| Example 20 | CRA-01 | 0.2 | (B)-1 | 0.02 | CL-01 | 0.03 | (D)-4 | 0.002 | — | — | (F)-1 | 15 | 2.38 |
| Example 21 | CRA-02 | 0.2 | (B)-1 | 0.02 | CL-01 | 0.03 | (D)-1 | 0.002 | — | — | (F)-2 | 15 | 2.38 |
| Example 22 | CRA-02 | 0.2 | (B)-1 | 0.02 | CL-01 | 0.03 | (D)-1 | 0.002 | — | — | (F)-2 | 15 | 2.38 |
| Example 23 | CRA-02 | 0.2 | (B)-1 | 0.02 | CL-03 | 0.03 | (D)-1 | 0.002 | — | — | (F)-2 | 15 | 2.38 |
| Example 24 | CRA-03 | 0.2 | (B)-1 | 0.02 | CL-01 | 0.03 | (D)-1 | 0.002 | — | — | (F)-1 | 15 | 0.60 |
| Example 25 | CRA-04 | 0.2 | (B)-1 | 0.02 | CL-01 | 0.03 | (D)-1 | 0.002 | — | — | (F)-1 | 15 | 0.60 |
| Example 26 | CRA-05 | 0.2 | (B)-1 | 0.02 | CL-01 | 0.03 | (D)-1 | 0.002 | — | — | (F)-1 | 15 | 2.38 |
| Example 27 | CRA-06 | 0.2 | (B)-1 | 0.02 | CL-01 | 0.03 | (D)-1 | 0.002 | — | — | (F)-1 | 15 | 2.38 |
| Example 28 | CRA-07 | 0.2 | (B)-1 | 0.02 | CL-01 | 0.03 | (D)-1 | 0.002 | — | — | (F)-1 | 15 | 2.38 |
| Example 29 | CRA-08 | 0.2 | (B)-1 | 0.02 | CL-01 | 0.03 | (D)-1 | 0.002 | — | — | (F)-1 | 15 | 0.12 |
| Example 30 | A-01 | 0.2 | (B)-1 | 0.04 | CL-05 | 0.04 | (D)-1 | 0.002 | — | — | (F)-2 | 15 | 0.12 |
| Example 31 | A-01 | 0.2 | (B)-1 | 0.04 | CL-05 | 0.04 | (D)-1 | 0.002 | (E)-1 | 0.002 | (F)-2 | 15 | 0.12 |
| Example 32 | A-02 | 0.2 | (B)-1 | 0.04 | CL-05 | 0.04 | (D)-1 | 0.002 | — | — | (F)-2 | 15 | 0.24 |
| Example 33 | A-03 | 0.2 | (B)-1 | 0.04 | CL-05 | 0.04 | (D)-1 | 0.002 | — | — | (F)-2 | 15 | 1.19 |

TABLE 4

| | Polyphenol Compound (A) | | Acid Generator (B) | | Crosslinking Agent (C) | | Organic Basic Compound (D) | | Alkali Soluble Polymer (E) | | Organic Solvent (F) | | Developing Solution |
|---|---|---|---|---|---|---|---|---|---|---|---|---|---|
| | | Amount (g) | | Amount (g) | | Amount (g) | | Amount (g) | | Amount (g) | | Amount (g) | Concentration (%) |
| Comparative Example 1 | CRA-01 | 0.2 | (B)-1 | 0.02 | CL-09 | 0.03 | (D)-1 | 0.002 | — | — | (F)-1 | 15 | 2.38 |
| Comparative Example 2 | CRA-01 | 0.2 | (B)-1 | 0.02 | CL-09 | 0.03 | (D)-1 | 0.002 | — | — | (F)-2 | 15 | 2.38 |
| Comparative Example 3 | CRA-01 | 0.2 | (B)-1 | 0.02 | CL-10 | 0.03 | (D)-1 | 0.002 | — | — | (F)-1 | 15 | 2.38 |
| Comparative Example 4 | CRA-01 | 0.2 | (B)-1 | 0.02 | CL-11 | 0.03 | (D)-1 | 0.002 | — | — | (F)-1 | 15 | 2.38 |
| Comparative Example 5 | A-01 | 0.2 | (B)-1 | 0.04 | CL-10 | 0.04 | (D)-1 | 0.002 | — | — | (F)-2 | 15 | 0.12 |
| Comparative Example 6 | A-02 | 0.2 | (B)-1 | 0.04 | CL-10 | 0.04 | (D)-1 | 0.002 | — | — | (F)-2 | 15 | 0.24 |
| Comparative Example 7 | A-03 | 0.2 | (B)-1 | 0.04 | CL-10 | 0.04 | (D)-1 | 0.002 | — | — | (F)-2 | 15 | 1.19 |

TABLE 5

| | Sensitivity ($\mu C/cm^2$) | Resolution (nm) |
|---|---|---|
| Example 1 | 90 | 26 |
| Example 2 | 85 | 24 |
| Example 3 | 52 | 24 |
| Example 4 | 180 | 22 |
| Example 5 | 130 | 24 |
| Example 6 | 94 | 22 |
| Example 7 | 55 | 22 |
| Example 8 | 130 | 24 |
| Example 9 | 100 | 24 |
| Example 10 | 60 | 24 |
| Example 11 | 55 | 24 |
| Example 12 | 50 | 22 |
| Example 13 | 50 | 22 |
| Example 14 | 48 | 22 |
| Example 15 | 45 | 24 |
| Example 16 | 80 | 22 |
| Example 17 | 48 | 22 |
| Example 18 | 60 | 24 |
| Example 19 | 120 | 30 |
| Example 20 | 90 | 26 |
| Example 21 | 88 | 30 |
| Example 22 | 44 | 26 |
| Example 23 | 52 | 26 |
| Example 24 | 88 | 30 |
| Example 25 | 160 | 30 |
| Example 26 | 85 | 28 |
| Example 27 | 95 | 28 |
| Example 28 | 140 | 30 |

TABLE 5-continued

| | Sensitivity ($\mu C/cm^2$) | Resolution (nm) |
|---|---|---|
| Example 29 | 120 | 32 |
| Example 30 | 35 | 30 |
| Example 31 | 35 | 28 |
| Example 32 | 100 | 24 |
| Example 33 | 25 | 26 |
| Comparative Example 1 | 66 | 35 |
| Comparative Example 2 | 60 | 35 |
| Comparative Example 3 | 260 | 32 |
| Comparative Example 4 | 460 | 35 |
| Comparative Example 5 | 210 | 60 |
| Comparative Example 6 | 150 | 40 |
| Comparative Example 7 | 160 | 50 |

CONCLUSION

From the results shown in Table 5, it is clear that well-shaped patterns with high sensitivity and high resolution were obtained in Examples 1 to 33. In Comparative Examples 1 and 2 using MBHP as the crosslinking agent, pattern collapse occurred when resolution was less than 35 nm. This is because MBHP has high solubility in alkali developing solutions, and when unreacted MBHP is present inside the pattern, it is dissolved out to decrease pattern strength. In contrast, the crosslinking agents each having a specific structure and being used in Examples 1 to 33 had higher hydrophobicity than MBHP, so that dissolution was suppressed during development and thus there was a decrease in pattern strength. As a result, pattern collapse was prevented and there was an increase in resolution. In Comparative Examples 3 to 7 using melamine-based crosslinking agents, the thus-obtained patterns did not have both excellent sensitivity and excellent resolution.

Patterns obtained in Examples 12 and 30 to 33 using CL-05 as the crosslinking agent, had excellent shape and good adhesion.

The invention claimed is:

1. A negative resist composition comprising:
(A) a polyphenol compound comprising two or more phenolic hydroxyl groups in a molecule thereof and having a molecular weight of 300 to 3,000;
(B) an acid generator which directly or indirectly produces acid by exposure to active energy rays having a wavelength of 248 nm or less; and
(C) a crosslinking agent represented by the following chemical formula (1):

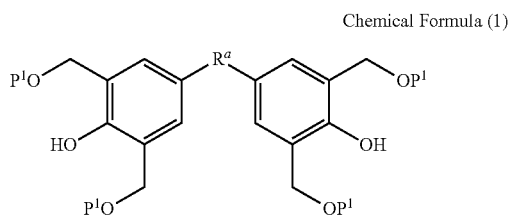

Chemical Formula (1)

wherein $R^a$ is an organic group having 2 to 20 carbon atoms, and $P^1$ is a hydrogen atom or an alkyl group, wherein $R^a$ of the chemical formula (1) is at least one selected from the group consisting of organic groups represented by the following chemical formulae (a) to (d):

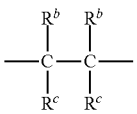

Chemical Formula (a)

wherein each $R^b$ is independently an alkyl group having 1 to 5 carbon atoms, and each $R^c$ is independently a hydrogen atom or an alkyl group having 1 to 5 carbon atoms;

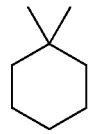

Chemical Formula (b)

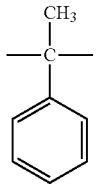

Chemical Formula (c)

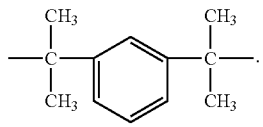

Chemical Formula (d)

2. The negative resist composition according to claim 1, wherein the polyphenol compound (A) has three or more phenolic hydroxyl groups in a molecule thereof, a glass transition temperature (Tg) of 90° C. or more, and a solubility of 0.5% by weight or more in organic solvents having a boiling point of 80 to 180° C.

3. The negative resist composition according to claim 1, wherein the polyphenol compound (A) is a compound represented by the following chemical formula (2):

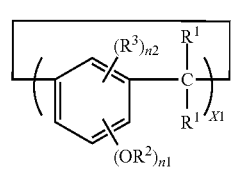

Chemical Formula (2)

wherein each $R^1$ is independently a hydrogen atom or one selected from the group consisting of an alkyl group, a cycloalkyl group, an aryl group and a group represented by the following chemical formula (3):

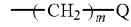

Chemical Formula (3)

wherein Q is an aryl group or a cycloalkyl group; m is 1 or 2; each $R^2$ is independently a hydrogen atom or an organic group; at least two $R^2$s are hydrogen atoms; $R^3$ is a halogen atom or one selected from the group consisting of an alkyl group, a cycloalkyl group, an aryl group, an alkoxy group, an acyl group, a cyano group and a nitro group; n1 is an integer of 1 to 3; n2 is an integer of 0 to 2; n1+n2≤4; x1 is an integer of 3 to 12; and groups represented by the same symbol in the chemical formula (2) may be identical or different.

4. The negative resist composition according to claim 1, further comprising (D) an organic basic compound.

5. A pattern forming method comprising the steps of:
(i) forming a resist film by applying the negative resist composition defined by any of claims 1 to 4 to a substrate and heating the same, and
(ii) exposing the resist film to electron beams, EUV or x-rays, heating the resist film and then developing the same.

6. A crosslinking agent represented by the following chemical formula (1),

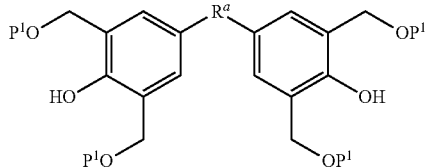

Chemical Formula (1)

wherein $R^a$ is an organic group having 2 to 20 carbon atoms, and $P^1$ is a hydrogen atom or an alkyl group, wherein $R^a$ of the chemical formula (1) is an organic group represented by the following chemical formula (a):

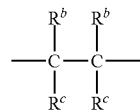

Chemical Formula (a)

wherein each $R^b$ is independently an alkyl group having 1 to 5 carbon atoms, and each $R^c$ is independently a hydrogen atom or an alkyl group having 1 to 5 carbon atoms.

* * * * *